United States Patent
Yamaoka

(10) Patent No.: US 10,796,771 B1
(45) Date of Patent: Oct. 6, 2020

(54) SEMICONDUCTOR MEMORY DEVICE

(71) Applicant: TOSHIBA MEMORY CORPORATION, Minato-ku, Tokyo (JP)

(72) Inventor: Masashi Yamaoka, Yokohama, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,734

(22) Filed: Sep. 4, 2019

(30) Foreign Application Priority Data

Mar. 22, 2019 (JP) .................................. 2019-054140

(51) Int. Cl.
*G11C 16/26* (2006.01)
*G11C 16/24* (2006.01)
*H01L 27/1158* (2017.01)
*H01L 27/1157* (2017.01)
*H01L 27/11565* (2017.01)

(52) U.S. Cl.
CPC .............. *G11C 16/26* (2013.01); *G11C 16/24* (2013.01); *H01L 27/1157* (2013.01); *H01L 27/1158* (2013.01); *H01L 27/11565* (2013.01)

(58) Field of Classification Search
None
See application file for complete search history.

(56) References Cited

U.S. PATENT DOCUMENTS

| 2009/0268523 A1* | 10/2009 | Maejima ............ G11C 16/3422 365/185.11 |
| 2013/0286748 A1 | 10/2013 | Sako |
| 2019/0180824 A1* | 6/2019 | Hsu ...................... G11C 29/021 |

FOREIGN PATENT DOCUMENTS

JP          2013232262 A      11/2013

* cited by examiner

*Primary Examiner* — Tan T. Nguyen
(74) *Attorney, Agent, or Firm* — Holtz, Holtz & Volek PC

(57) ABSTRACT

According to an embodiment, a semiconductor memory device includes first and second groups each including a plurality of memory cells, and a control circuit. The control circuit is configured to successively apply a first voltage and a second voltage which is higher than the first voltage to a memory cell in the first or second group, and to apply a third voltage to the memory cell after applying the second voltage. When the memory cell is included in the first group, the control circuit applies the third voltage to the memory cell a time earlier with respect to a time when the second voltage is applied than when the memory cell is included in the second group. Each of the first and second groups corresponds to a data erase unit or a unit larger than the data erase unit.

16 Claims, 16 Drawing Sheets

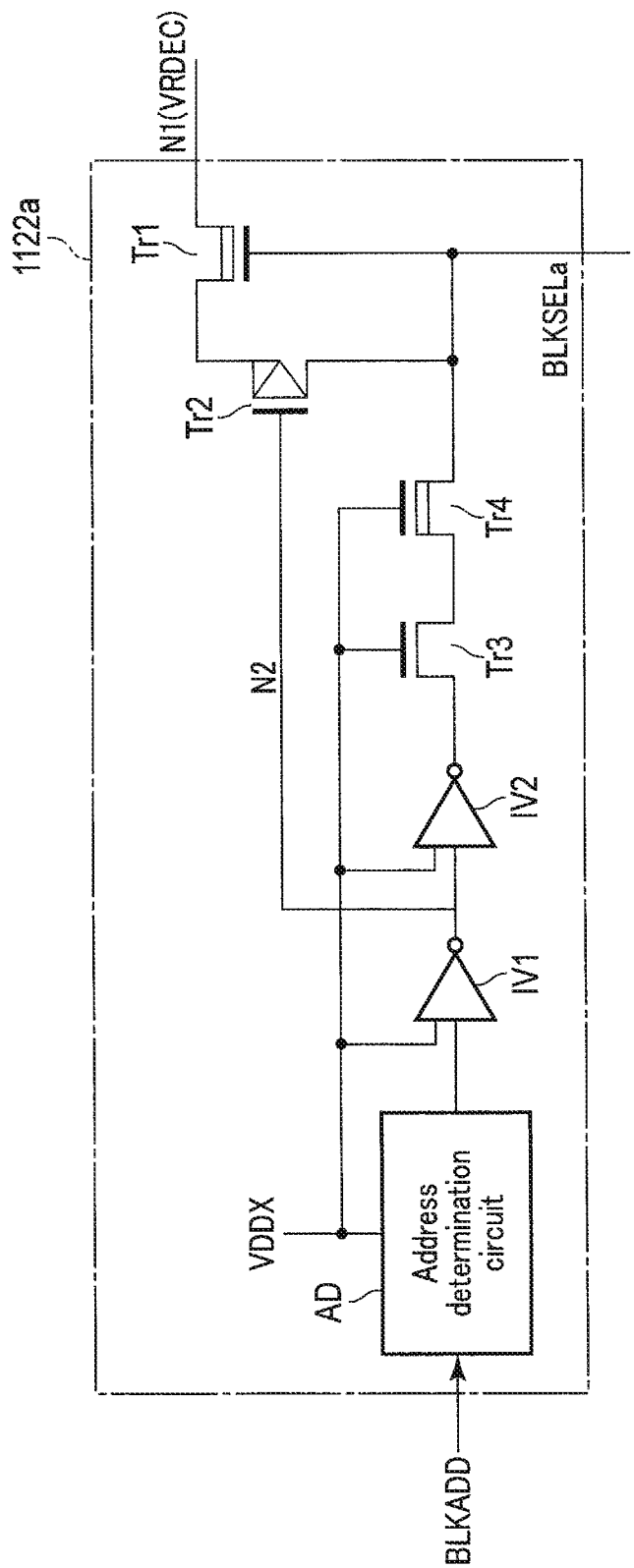
F I G. 9

SEMICONDUCTOR MEMORY DEVICE

CROSS-REFERENCE TO RELATED APPLICATIONS

This application is based upon and claims the benefit of priority from Japanese Patent Application No. 2019-054140, filed Mar. 22, 2019, the entire contents of which are incorporated herein by reference.

FIELD

Embodiments described herein relate generally to a semiconductor memory device.

BACKGROUND

As a semiconductor memory device, a NAND flash memory is known.

BRIEF DESCRIPTION OF THE DRAWINGS

FIG. 9 is a diagram showing an example of the circuit configuration of a block decoder in the row decoder module of the semiconductor memory device according to the first embodiment;

DETAILED DESCRIPTION

Figure 1:
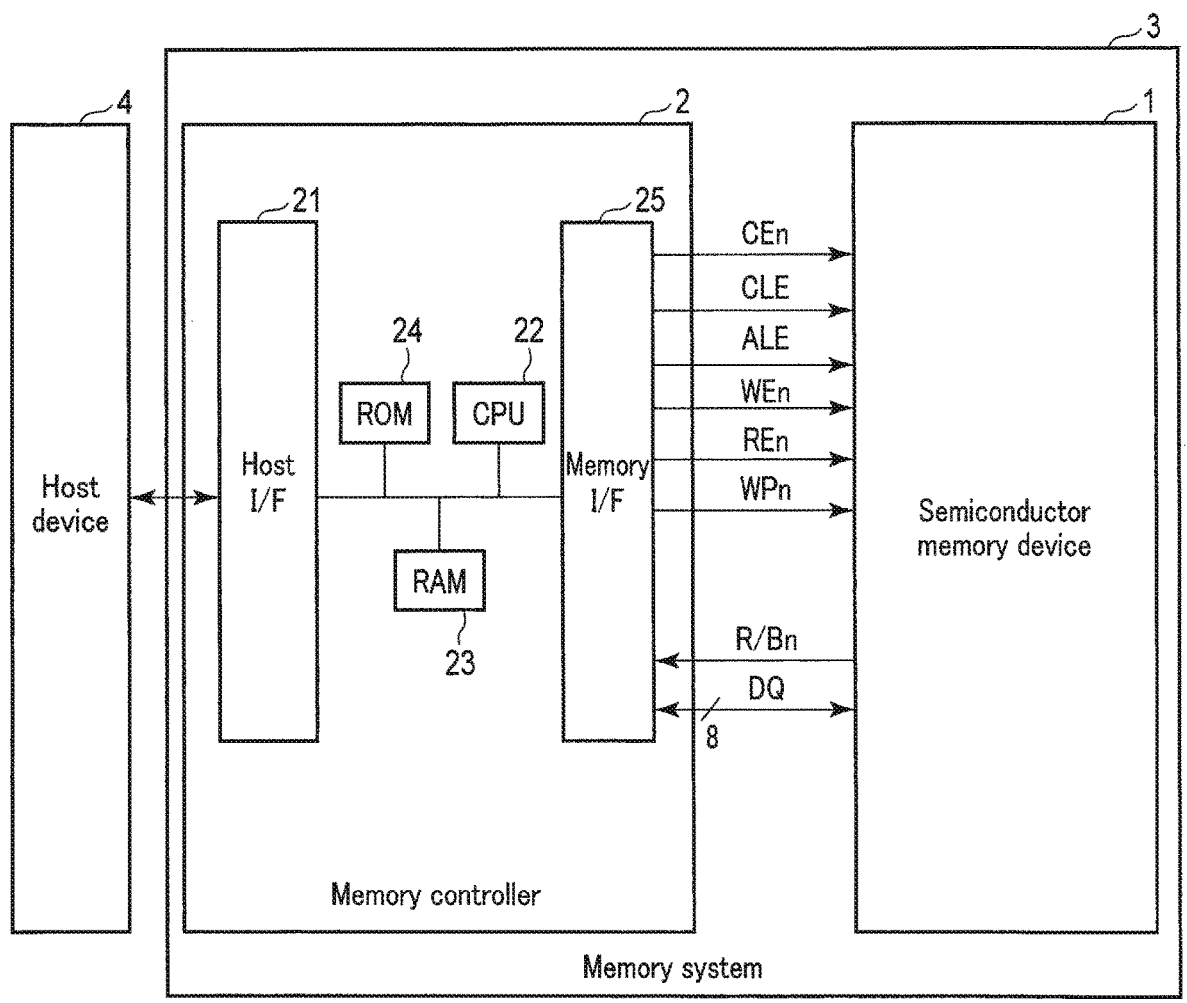
FIG. 1 is a block diagram showing an example of the configuration of a memory system including a semiconductor memory device according to a first embodiment.

Generally, according to an embodiment, a semiconductor memory device includes a first group including a plurality of memory cells, a second group including a plurality of memory cells, and a control circuit. The control circuit is configured to successively apply a first voltage and a second voltage which is higher than the first voltage to a first memory cell in the first group or the second group, and to apply a third voltage to the first memory cell after applying the second voltage. When the first memory cell is included in the first group, the control circuit applies the third voltage to the first memory cell a first time earlier with respect to a time when the second voltage is applied than when the first memory cell is included in the second group. Each of the first group and the second group corresponds to a data erase unit or a unit larger than the data erase unit.

Hereinafter, embodiments will be described with reference to the drawings. In the following description, elements having the same function and configuration will be assigned with a common reference numeral or symbol. A plurality of elements assigned with a common reference numeral or symbol are distinguished from each other by a numeral or symbol accompanying the common reference numeral or symbol. When a plurality of elements are not particularly distinguished from each other, the elements are assigned with only a common reference numeral or symbol without an accompanying numeral or symbol.

First Embodiment

Hereinafter, a semiconductor memory device 1 according to the first embodiment will be described.

Configuration Example (1) Memory System

FIG. 1 is a block diagram showing an example of the configuration of a memory system 3 including the semiconductor memory device 1 according to the first embodiment.

As shown in FIG. 1, the memory system 3 includes a semiconductor memory device 1 and a memory controller 2, and is controlled by a host device 4. The memory system 3 is, for example, a solid state drive (SSD) or an SD (registered trademark) card.

The semiconductor memory device 1 is controlled by the memory controller 2. The memory controller 2 receives an instruction from the host device 4, and controls the semiconductor memory device 1 based on the received instruction.

The memory controller 2 includes a host interface unit 21, a central processing unit (CPU) 22, a random access memory (RAM) 23, a read only memory (ROM) 24, and a memory interface unit 25. The memory controller 2 is configured as, for example, a system-on-a-chip (SoC).

The ROM 24 stores firmware (a program). The RAM 23 can retain the firmware and is used as a work area of the CPU 22. The RAM 23 also temporarily retains data, and functions as a buffer and a cache. The firmware stored in the ROM 24 and loaded into the RAM 23 is executed by the CPU 22. The memory controller 2 thereby executes various operations including a write operation and read operation to be described later, as well as some functions of the host interface unit 21 and the memory interface unit 25.

The host interface unit 21 is coupled to the host device 4 via a bus, and controls communication between the memory controller 2 and the host device 4. The memory interface unit 25 is coupled to the semiconductor memory device 1 via memory buses, and controls communication between the memory controller 2 and the semiconductor memory device 1. The memory buses transfer, for example, a chip enable signal CEn, a command latch enable signal CLE, an address latch enable signal ALE, a write enable signal WEn, a read enable signal REn, a write protect signal WPn, a ready/busy signal R/Bn, and signals DQ.

(2) Semiconductor Memory Device

Figure 2:
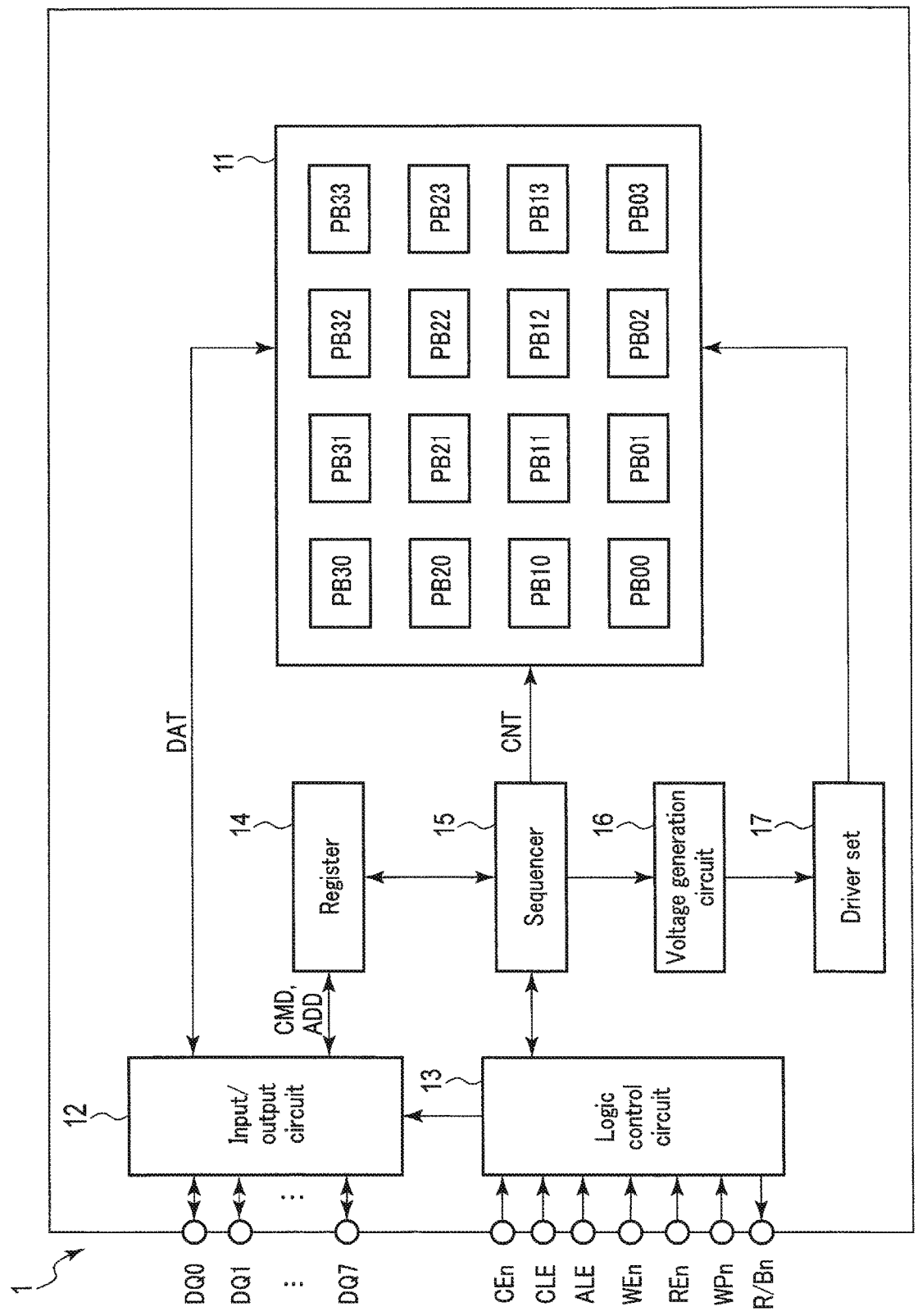
FIG. 2 is a block diagram showing an example of the configuration of the semiconductor memory device according to the first embodiment.

FIG. 2 is a block diagram showing an example of the configuration of the semiconductor memory device 1 according to the first embodiment. The semiconductor memory device 1 according to the first embodiment is, for example, a NAND flash memory capable of nonvolatilely storing data.

As shown in FIG. 2, the semiconductor memory device 1 includes a core part 11, an input/output circuit 12, a logic control circuit 13, a register 14, a sequencer 15, a voltage generation circuit 16, and a driver set 17.

The core part 11 includes a plurality of planes PB (PB00, PB01, PB02, PB03, PB10, PB11, PB12, PB13, PB20, PB21, PB22, PB23, PB30, PB31, PB32, and PB33). For example, the planes have the same configuration. In the semiconductor memory device 1, various operations are performed, such as a write operation to store write data DAT in a memory cell array of each plane, and a read operation to read read data DAT from a memory cell array of each plane.

The input/output circuit 12 transmits and receives signals DQ0 to DQ7 to and from the memory controller 2. Signals DQ includes, for example, a command CMD, data DAT, and address information ADD. The command CMD includes, for example, an instruction to execute an instruction from the host device 4. Data DAT includes write data DAT or read data DAT. The address information ADD includes, for example, a column address and a block address. The address information ADD also includes, for example, a plane address.

Specifically, the input/output circuit 12 receives write data DAT, a command CMD, and address information ADD from the memory controller 2, transfers the received write data DAT to the core part 11, and transfers the received address information ADD and command CMD to the register 14. The input/output circuit 12 also receives read data DAT from the core part 11, and transmits the received read data DAT to the memory controller 2.

The logic control circuit 13 receives from the memory controller 2, for example, a chip enable signal CEn, a command latch enable signal CLE, an address latch enable signal ALE, a write enable signal WEn, a read enable signal REn, and a write protect signal WPn. The logic control circuit 13 controls the input/output circuit 12 and the sequencer 15 based on the received signal.

The chip enable signal CEn is a signal used for enabling the semiconductor memory device 1. The command latch enable signal CLE is a signal used for notifying the input/output circuit 12 that signals DQ input to the semiconductor memory device 1 serve as a command CMD. The address latch enable signal ALE is a signal used for notifying the input/output circuit 12 that signals DQ input to the semiconductor memory device 1 serve as address information ADD. The write enable signal WEn and read enable signal REn are a signal used for instructing the input/output circuit 12 to input or output, for example, signals DQ. The write protect signal WPn is a signal used for instructing the semiconductor memory device 1 not to write or erase data.

The logic control circuit 13 also generates a ready/busy signal R/Bn in accordance with control by the sequencer 15, and transmits the generated ready/busy signal R/Bn to the memory controller 2. The ready/busy signal R/Bn is a signal used for notifying the memory controller 2 of whether the semiconductor memory device 1 is in a ready state in which the semiconductor memory device 1 accepts an instruction from the memory controller 2 or in a busy state in which the semiconductor memory device 1 does not accept the instruction.

The register 14 retains a command CMD and address information ADD transferred from the input/output circuit 12. The register 14 transfers, for example, the command CMD and address information ADD to the sequencer 15.

The sequencer 15 controls the overall operation of the semiconductor memory device 1 based on the command CMD retained in the register 14. For example, the sequencer 15 generates a control signal CNT based on the address information ADD retained in the register 14, and outputs the generated control signal CNT to the core part 11. The control signal CNT includes, for example, a block address. The control signal CNT enables control of a target plane of a plurality of planes PB included in the core part 11. The sequencer 15 controls the voltage generation circuit 16, the driver set 17, and the target plane to execute various operations, such as a data write operation, read operation, and erase operation, on the target plane.

Based on the control by the sequencer 15, the voltage generation circuit 16 generates voltages used for, for example, a write operation, read operation, and erase operation, and supplies the generated voltages to the driver set 17.

The driver set 17 transfers, for example, the voltages supplied from the voltage generation circuit 16 to the core part 11.

(3) Plane

Figure 3:
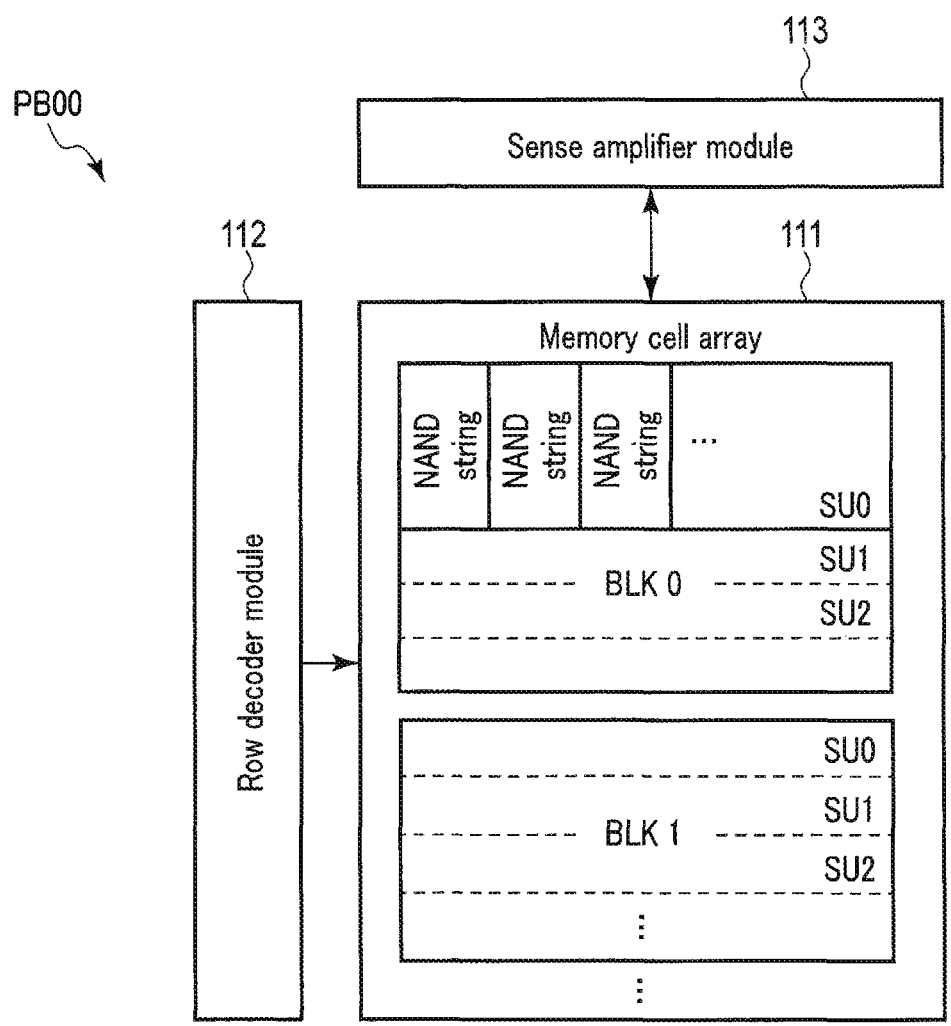
FIG. 3 is a block diagram showing an example of the configuration of a plane of the semiconductor memory device according to the first embodiment.

FIG. 3 is a block diagram showing an example of the configuration of a plane PB of the semiconductor memory device 1 according to the first embodiment. As an example of the configuration of a plane PB, FIG. 3 shows an example of the configuration of plane PB00 of the planes PB. Each of the planes PB has, for example, the same configuration as the configuration of plane PB00 shown in FIG. 3.

As shown in FIG. 3, plane PB00 includes a memory cell array 111, a row decoder module 112, and a sense amplifier module 113.

The memory cell array 111 includes a plurality of blocks BLK (BLK0, BLK1, . . . ). Each block BLK includes a plurality of nonvolatile memory cell transistors (not shown), each of which is associated with a bit line and a word line, and corresponds to, for example, a data erase unit. The semiconductor memory device 1 can be of, for example, a single-level cell (SLC) type or multi-level cell (MLC) type. Each memory cell transistor retains 1-bit data in the SLC type, whereas each memory cell transistor retains 2-bit data in the MLC type. Each memory cell transistor may be configured to retain 3 or more-bit data.

Each block BLK includes a plurality of string units SU (SU0, SU1, . . . ). Each string unit SU includes a plurality of NAND strings NS.

Different block addresses are assigned to the blocks BLK of plane PB00. A block address assigned to a block BLK of plane PB00 may be assigned to a block BLK of a plane PB other than plane PB00. The blocks BLK of different planes PB assigned with the same block address can be distinguished from each other based on their plane addresses.

The row decoder module 112 receives a block address in the address information ADD retained in the register 14, and selects a target block BLK, etc., on which various operations, such as a read operation and a write operation, are executed, based on the received block address. The row decoder module 112 can transfer voltages supplied from the driver set 17 to the selected block BLK.

The sense amplifier module 113 receives a column address in the address information ADD retained in the register 14, and executes a transfer operation of data DAT between the memory controller 2 and the memory cell array 111 based on the received column address as described below. The sense amplifier module 113 senses the threshold voltages of memory cell transistors in the memory cell array 111 to generate read data DAT, and outputs the generated read data DAT from the memory cell array 111 to the memory controller 2 via the input/output circuit 12. The sense amplifier module 113 also receives write data DAT from the memory controller 2 via the input/output circuit 12, and transfers the received write data DAT to the memory cell array 111.

(4) Memory Cell Array

Figure 4:
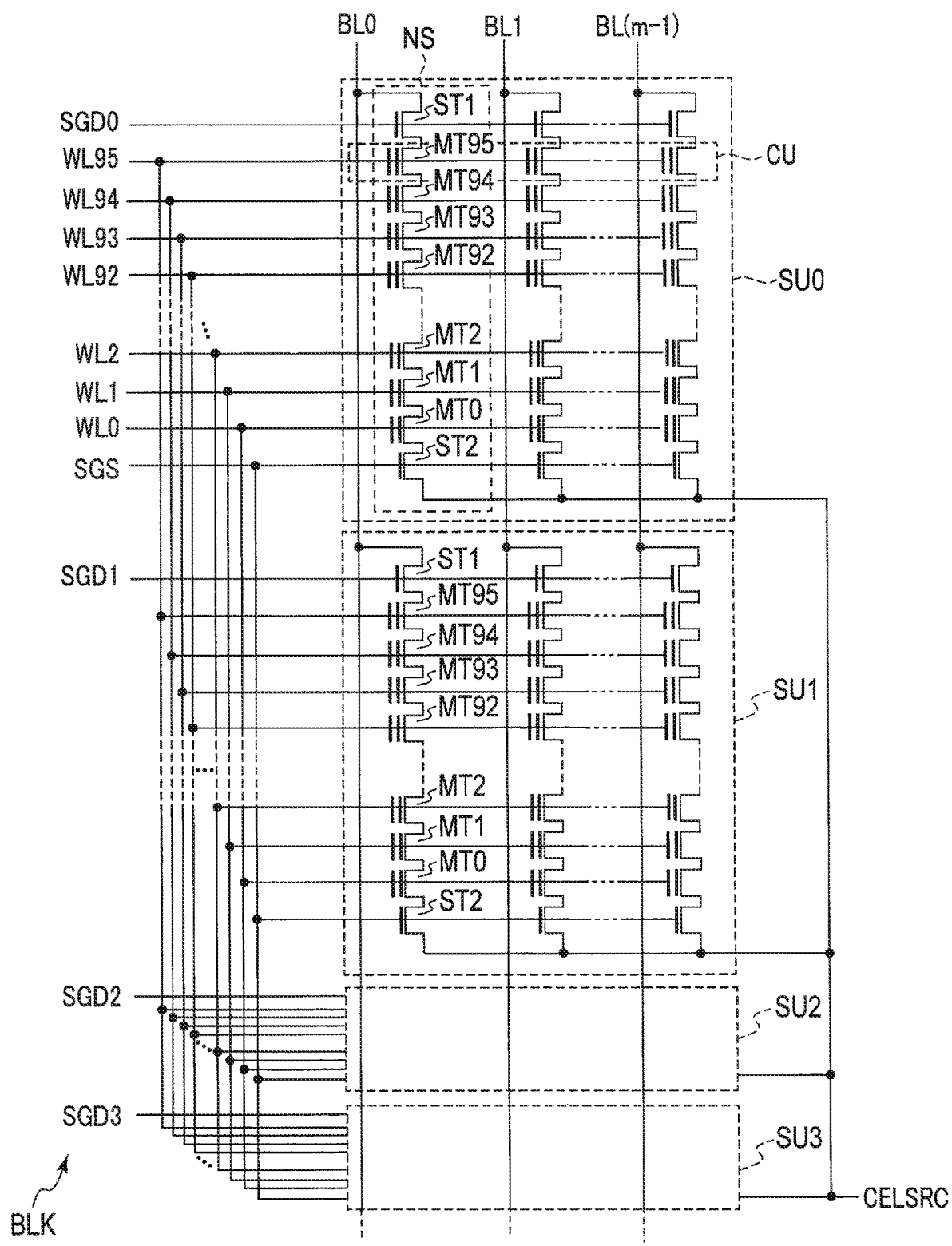
FIG. 4 is a diagram showing an example of the circuit configuration of a memory cell array of the semiconductor memory device according to the first embodiment.

FIG. 4 is a diagram showing an example of the circuit configuration of the memory cell array 111 in the semiconductor memory device 1 according to the first embodiment. As an example of the circuit configuration of the memory cell array 111, FIG. 4 shows an example of the circuit configuration of one block BLK of a plurality of blocks BLK included in the memory cell array 111. For example, each of a plurality of blocks BLK included in the memory cell array 111 has the circuit configuration shown in FIG. 4.

FIG. 4 shows the case where the block BLK includes four string units SU0 to SU3, as an example. The NAND strings NS included in each string unit SU are coupled to respective bit lines BL0 to BL(m−1) (m is an integer not less than 1), and each include, for example, memory cell transistors MT0 to MT95 and select transistors ST1 and ST2. Each memory cell transistor MT includes a control gate and a charge storage layer, and nonvolatilely stores data. The select transistors ST1 and ST2 are used in various operations to select the NAND string NS that includes the select transistors ST1 and ST2.

The drain of select transistor ST1 of each NAND string NS is coupled to the corresponding bit line BL. Memory cell transistors MT0 to MT95 are coupled in series between the source of select transistor ST1 and the drain of select transistor ST2. The source of select transistor ST2 is coupled to a source line CELSRC.

The gates (control gates) of select transistors ST1 of the NAND strings NS in the same string unit SUj are coupled in common to select gate line SGDj. In the example of FIG. 4, j is an integer of 0 to 3. The gates of select transistors ST2 of the NAND strings NS in the same block BLK are coupled in common to a select gate line SGS. The control gates of memory cell transistors MTk of the NAND strings NS in the same block BLK are coupled in common to word line WLk. In the example of FIG. 4, k is an integer of 0 to 95.

Each bit line BL is coupled to the drains of select transistors ST1 of corresponding NAND strings NS of the string units SU. The source line CELSRC is shared by a plurality of string units SU.

A set of memory cell transistors MT coupled in common to a word line WL in one string unit SU is called, for example, a "cell unit CU". For example, a set of bits retained at the same bit position in the memory cell transistors MT in the cell unit CU is called, for example, "1 page".

A circuit configuration of the memory cell array 111 is described above; however, the circuit configuration is not limited thereto. For example, the number of string units SU included in each block BLK may be any number. The number of memory cell transistors MT, the number of select transistors ST1, and the number of select transistors ST2 in each NAND string NS may also be any number. The numbers of word lines WL and select gate lines SGD and SGS may be changed based on the numbers of memory cell transistors MT and select transistors ST1 and ST2 in the NAND string NS.

(5) Threshold Voltage Distribution of Memory Cell Transistors

Figure 5:
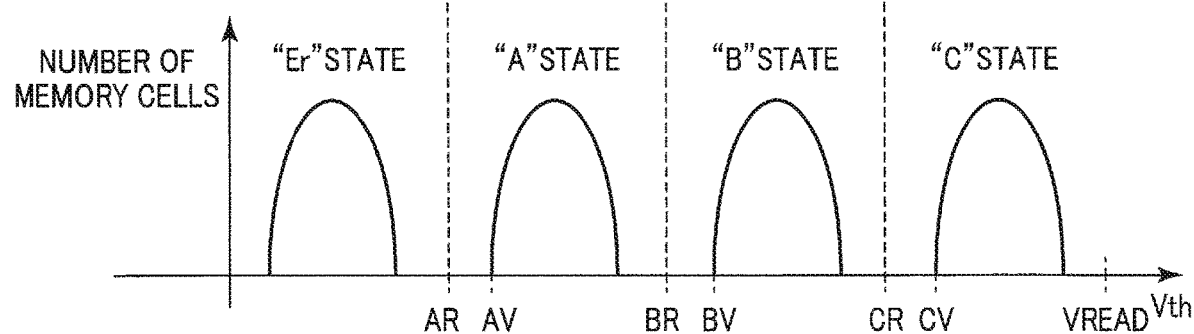
FIG. 5 is a diagram showing an example of threshold voltage distribution of memory cell transistors of the semiconductor memory device according to the first embodiment.

FIG. 5 is a diagram showing an example of threshold voltage distribution, data allocation, read voltages, and verification voltages in the case where each memory cell transistor MT in the memory cell array 111 shown in FIG. 3 retains 2-bit data.

The memory cell transistor MT retains the 2-bit data based on the potential difference (hereinafter referred to as a "threshold voltage") between the gate and source, which enables switching of the memory cell transistor MT from OFF to ON. In a write operation, this threshold voltage of the memory cell transistor MT is controlled. FIG. 5 shows four threshold voltage distribution lobes obtained as a result of such threshold voltage control in the case where the memory cell transistor MT retains 2-bit data. In the threshold voltage distribution shown in FIG. 5, the vertical axis represents the number of memory cell transistors MT, and the horizontal axis represents threshold voltages Vth of the memory cell transistors MT. As an example, the horizontal axis indicates voltages applied to the gate of a memory cell transistor MT which enable switching of the memory cell transistor MT from OFF to ON when voltage VSS is applied to the source of the memory cell transistor MT. Voltage VSS is, for example, a reference voltage.

For example, which state of the "Er" state, "A" state, "B" state, and "C" state a memory cell transistors MT is in is determined based on which of the four threshold voltage distribution lobes the threshold voltage of the memory cell transistor MT is included in. The threshold voltage distribution lobes corresponding to the "Er" state, "A" state, "B" state, and "C" state are provided in the ascending order of threshold voltages of memory cell transistors MT. For example, data "11" ("upper bit/lower bit") is allocated to the "Er" state, data "01" is allocated to the "A" state, data "00" is allocated to the "B" state, and data "10" is allocated to the "C" state. Data allocated to the state which the memory cell transistor MT is in is the data stored in the memory cell transistor MT.

In a write operation, a verification operation to confirm whether the threshold voltage of a memory cell transistor MT has exceeded a predetermined voltage is performed. A verification voltage used in the verification operation is set. Specifically, verification voltage AV is set for the "A" state, verification voltage BV is set for the "B" state, and verification voltage CV is set for the "C" state.

For example, when verification voltage AV is applied, a memory cell transistor MT that is turned on turns out to be in the "Er" state, and a memory cell transistor MT that is OFF turns out to be in the "A" or higher state. This enables confirmation of whether the threshold voltage of a write target memory cell transistor MT is included in the threshold voltage distribution lobe of the "A" or higher state as a result of, for example, a write operation to write data "01". The same applies to the other verification voltages BV and CV.

A read voltage used in a read operation for determining which state a memory cell transistor MT is in is set. Specifically, read voltage AR is set for the "A" state, read voltage BR is set for the "B" state, and read voltage CR is set for the "C" state.

For example, when read voltage AR is applied, a memory cell transistor MT that is turned on turns out to be in the "Er" state, and a memory cell transistor MT that is OFF turns out to be in the "A" or higher state. This enables determination of whether a memory cell transistor MT is in the "Er" state or in the "A" or higher state. The same applies to the other read voltages BR and CR.

The above verification voltages and read voltages have the following relationship: Verification voltage AV is higher than read voltage AR, verification voltage BV is higher than read voltage BR, and verification voltage CV is higher than read voltage CR.

In addition, a read pass voltage VREAD is set to be always higher than the threshold voltages of the memory cell transistors MT in the highest "C" state. When the read pass voltage VREAD is applied to the gate of a memory cell transistor MT, the memory cell transistor MT is turned on regardless of data stored therein.

The number of bits of data stored in one memory cell transistor MT and the data allocation to threshold voltage distribution lobes are described above as an example, and are not limited thereto.

(6) Sense Amplifier Module

Figure 6:
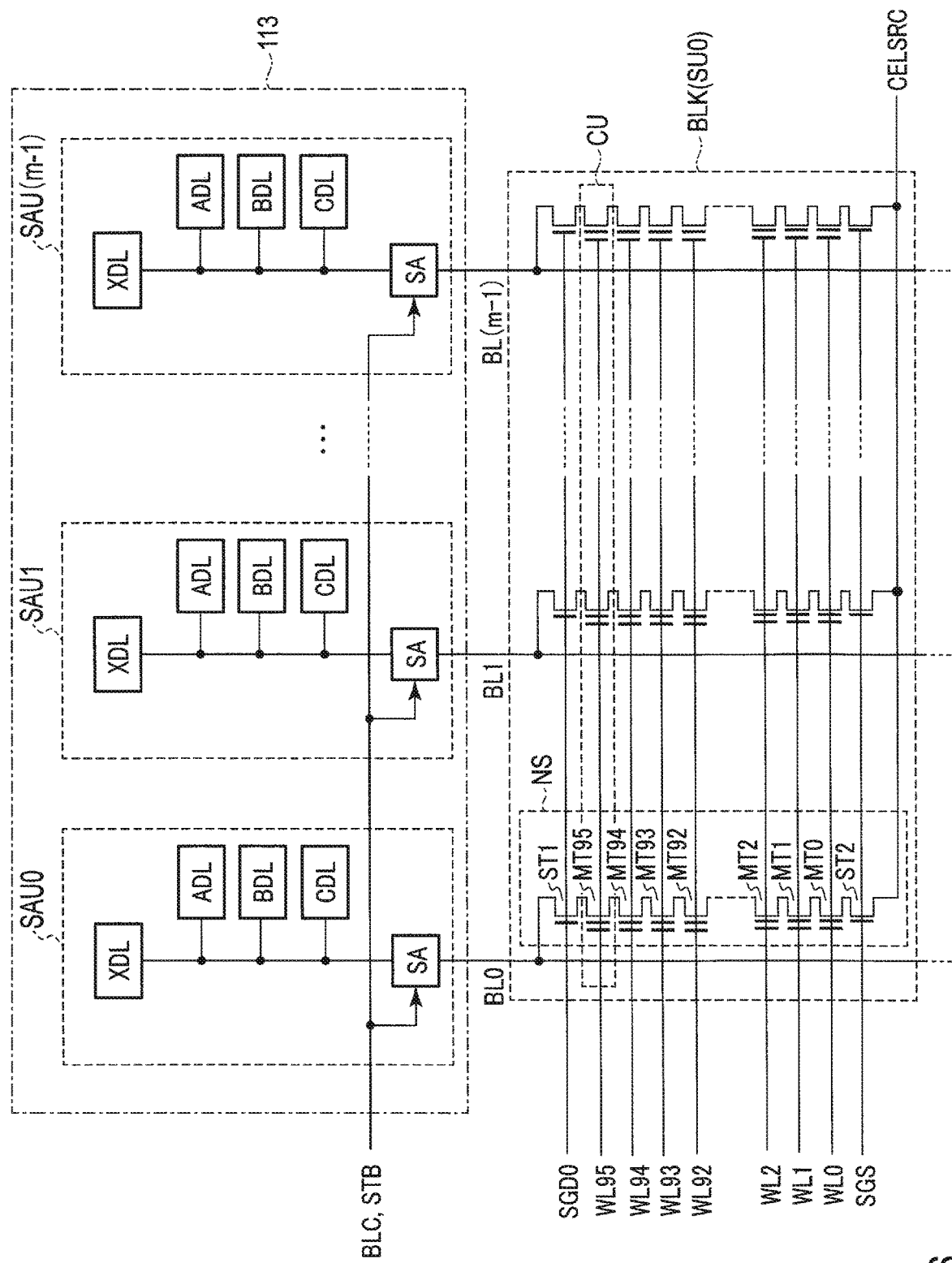
FIG. 6 is a block diagram showing an example of the configuration of a sense amplifier module of the semiconductor memory device according to the first embodiment.

FIG. 6 is a block diagram showing an example of the configuration of the sense amplifier module 113 of the semiconductor memory device 1 according to the first embodiment. In the following description, a write target or read target memory cell transistor MT will be referred to as a selected memory cell transistor MT. The configuration of the sense amplifier module 113 described in detail below is merely an example, and various configurations are applicable to the sense amplifier module 113.

As shown in FIG. 6, the sense amplifier module 113 includes m sense amplifier units SAU0 to SAU(m−1), for example, provided for the respective bit lines BL.

Each sense amplifier unit SAU includes, for example, a sense amplifier circuit SA and latch circuits ADL, BDL, CDL, and XDL. The number of latch circuits included in each sense amplifier unit SAU is based on, for example, the number of bits of data retained in each memory cell transistor MT.

The sense amplifier circuit SA senses the threshold voltage of a selected memory cell transistor MT coupled to the corresponding bit line BL.

The sense amplifier circuit SA is supplied with control signal BLC by, for example, the sequencer 15. The sense amplifier circuit SA is enabled to clamp the corresponding bit line BL to have a potential corresponding to the control signal BLC.

The sense amplifier circuit SA is configured to change the potential of a node (not shown) to different levels in accordance with whether the selected memory cell transistor MT to which a read voltage is applied is OFF or ON. Hereinafter, the node is called a sense node. The sense amplifier circuit SA is supplied with control signal STB by, for example, the sequencer 15 after the potential of the sense node has been changed to such an extent as to enable determination of the state of the selected memory cell transistor MT. In accordance with the potential of the sense node at the time when control signal STB is asserted, data "0" or "1" is transferred to, for example, one of the latch circuits ADL, BDL, CDL, and XDL.

Latch circuits ADL, BDL, and CDL temporarily retain read data and write data.

Those sense amplifier circuit SA and latch circuits ADL, BDL, and CDL are coupled to one another by a bus so that data can be transmitted and received therebetween. The bus is coupled to latch circuit XDL.

Latch circuit XDL enables data transmission and reception between the corresponding sense amplifier unit SAU and the input/output circuit 12. Namely, data received from, for example, the memory controller 2 is first retained in latch circuit XDL, and then transferred to latch circuit ADL, latch circuit BDL, latch circuit CDL, or the sense amplifier circuit SA. Similarly, data in latch circuit ADL, latch circuit BDL, latch circuit CDL, or the sense amplifier circuit SA is transferred to latch circuit XDL and retained therein, and then transferred to the input/output circuit 12 and output to the outside of the semiconductor memory device 1.

(7) Row Decoder Module

Figure 7:
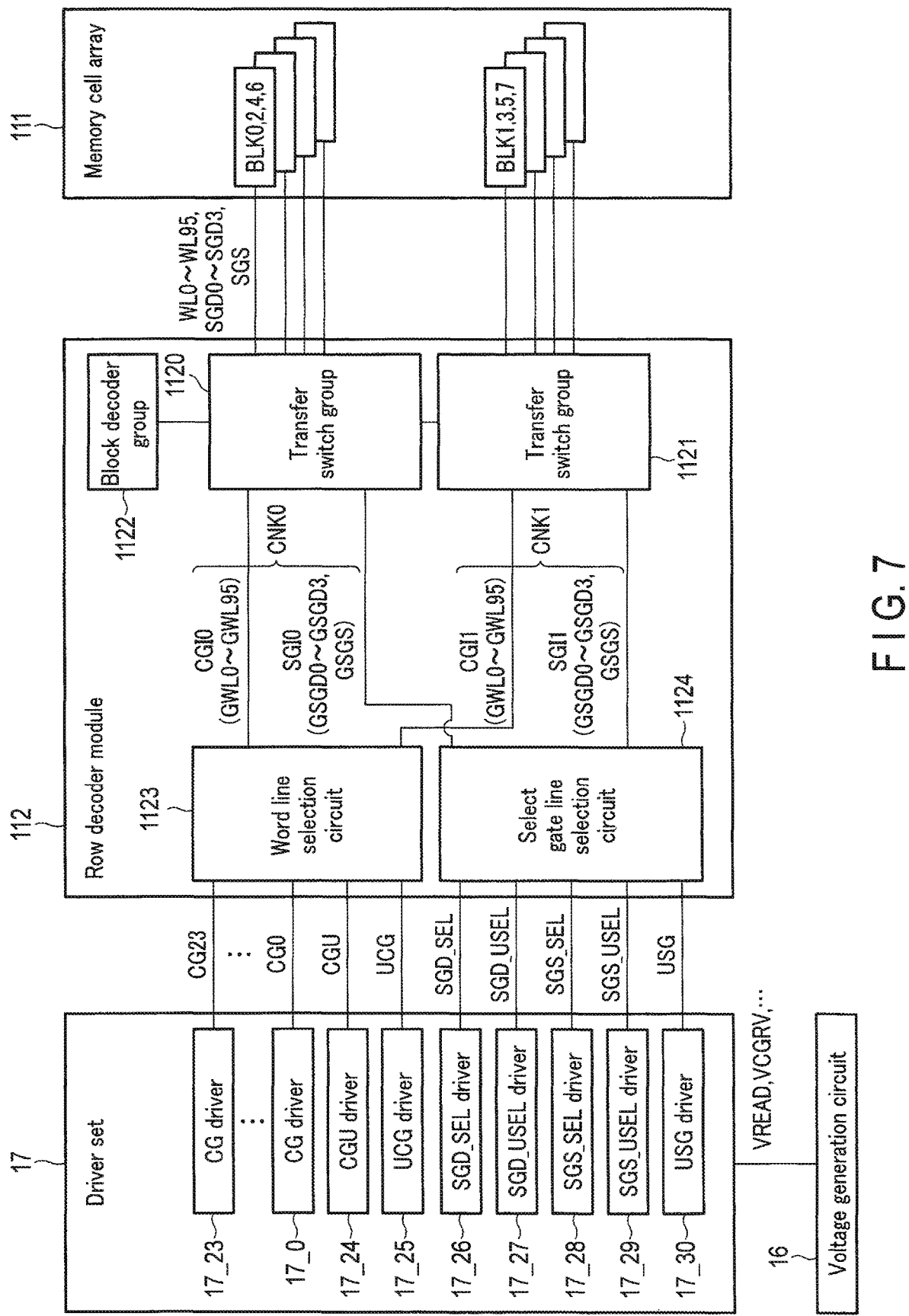
FIG. 7 is a block diagram showing an example of the configuration of each of a row decoder module and a driver set of the semiconductor memory device according to the first embodiment.

FIG. 7 is a block diagram showing an example of the configuration of each of the row decoder module 112 and driver set 17 of the semiconductor memory device 1 according to the first embodiment. As an example, FIG. 7 shows the case where the memory cell array 111 includes eight blocks BLK0 to BLK7. Hereinafter, supply and transfer of a voltage will be described while taking a read operation as an example.

The row decoder module 112 is coupled to blocks BLK0 to BLK7 via different sets of word lines WL0 to WL95 and select gate lines SGD0 to SGD3 and SGS.

First, the configuration of the driver set 17 will be described.

The voltage generation circuit 16 generates, for example, voltages VREAD and VCGRV, which are voltages used in a read operation, and supplies the generated voltages to the driver set 17. Voltage VCGRV is used as a generic name for the above-described read voltages. In addition to those voltages supplied from the voltage generation circuit 16, for example, voltage VSS is supplied to the driver set 17.

The driver set 17 includes, for example, CG drivers 17_0 to 17_23, a CGU driver 17_24, a UCG driver 17_25, an SGD_SEL driver 17_26, an SGD_USEL driver 1727, an SGS_SEL driver 17_28, an SGS_USEL driver 17_29, and a USG driver 17_30.

The CG driver 17_*i* is coupled to interconnect CGi, where i is an integer of 0 to 23. The CGU driver 17_24 is coupled to interconnect CGU, and the UCG driver 17_25 is coupled to interconnect UCG.

The CG drivers 17_0 to 17_23 enable transfer of voltages applied to, for example, 24 word lines WL including the selected word line WL of the 96 word lines WL in the selected block BLK. The CGU driver 17_24 enables transfer of a voltage applied to, for example, 72 word lines WL other than the above-described 24 word lines WL of the 96 word lines WL in the selected block BLK. The UCG driver 17_25 enables transfer of a voltage applied to, for example, the word lines WL of an unselected block BLK. Of the voltages supplied to the driver set 17, the voltages applied to the word lines WL are transferred to various interconnects CG0 to CG23, CGU, and UCG via those drivers.

The SGD_SEL driver 17_26 is coupled to interconnect SGD_SEL. The SGD_USEL driver 17_27 is coupled to interconnect SGD_USEL. The SGS_SEL driver 17_28 is coupled to interconnect SGS_SEL. The SGS_USEL driver 17_29 is coupled to interconnect SGS_USEL. The USG driver 17_30 is coupled to interconnect USG.

The SGD_SEL driver 17_26 enables transfer of a voltage applied to, for example, the select gate line of the selected string unit SU of the select gate lines SGD0 to SGD3 of the selected block BLK. The SGD_USEL driver 17_27 enables transfer of a voltage applied to, for example, the select gate lines of the unselected string units SU of the select gate lines SGD0 to SGD3 of the selected block BLK. The SGS_SEL driver 17_28 enables transfer of a voltage applied to, for example, select gate line SGS of the selected block BLK. The SGS_USEL driver 17_29 enables transfer of a voltage applied to, for example, select gate line SGS of the unselected block BLK. The USG driver 17_30 enables transfer of a voltage applied to, for example, select gate lines SGD0 to SGD3 of the unselected block BLK. Of the voltages applied to the driver set 17, the voltages applied to select gate lines SGD and SGS are transferred to various interconnects SGD_SEL, SGD_USEL, SGS_SEL, SGS_USEL, and USG via those drivers.

Next, the configuration of the row decoder module 112 will be described.

The row decoder module 112 includes transfer switch groups 1120 and 1121, a block decoder group 1122, a word line selection circuit 1123, and a select gate line selection circuit 1124.

The word line selection circuit 1123 is coupled to interconnects CG0 to CG23, CGU, and UCG. The word line selection circuit 1123 is also coupled to transfer switch group 1120 via interconnect group CGI0, and coupled to transfer switch group 1121 via interconnect group CGI1. Interconnect groups CGI0 and CGI1 each include, for example, 96 interconnects GWL0 to GWL95.

The select gate line selection circuit 1124 is coupled to interconnects SGD_SEL, SGD_USEL, SGS_SEL, SGS_USEL, and USG. The select gate line selection circuit 1124 is also coupled to transfer switch group 1120 via interconnect group SGI0, and coupled to transfer switch group 1121 via interconnect group SGI1. Interconnect groups SGI0 and SGI1 each include, for example, 4 interconnects GSGD0 to GSGD3 and one interconnect GSGS.

Transfer switch group 1120 is coupled to, for example, each of blocks BLK0, BLK2, BLK4, and BLK6. Specifically, transfer switch group 1120 is coupled to the blocks BLK via different sets of word lines WL0 to WL95 and select gate lines SGD0 to SGD3 and SGS.

Transfer switch group 1121 is coupled to, for example, each of blocks BLK1, BLK3, BLK5, and BLK7. Specifically, transfer switch group 1121 is coupled to the blocks BLK via different sets of word lines WL0 to WL95 and select gate lines SGD0 to SGD3 and SGS.

The blocks BLK0 to BLK7 are classified according to which set of interconnect group CGI and interconnect group SGI is coupled to the block BLK via transfer switch group 1120 or 1121. Such a set of interconnect group CGI and interconnect group SGI is also called a "chunk CNK". For example, the set of interconnect groups CGI0 and SGI0 corresponds to chunk CNK0, and the set of interconnect groups CGI1 and SGI1 corresponds to chunk CNK1.

The sequencer 15 enables electrical coupling of, for example, interconnects CG0 to CG23, CGU, SGD_SEL, SGD_USEL, and SGS_SEL to the interconnect groups CGI and SGI of the chunk CNK coupled to the selected block BLK. The sequencer 15 also enables electrical coupling of, for example, interconnects UCG, SGS_USEL, and USG to the interconnect groups CGI and SGI of the chunk CNK not coupled to the selected block BLK.

The block decoder group 1122 is coupled to the transfer switch groups 1120 and 1121. The block decoder group 1122 outputs a signal relating to selection of a block BLK to the transfer switch groups 1120 and 1121.

Figure 8:
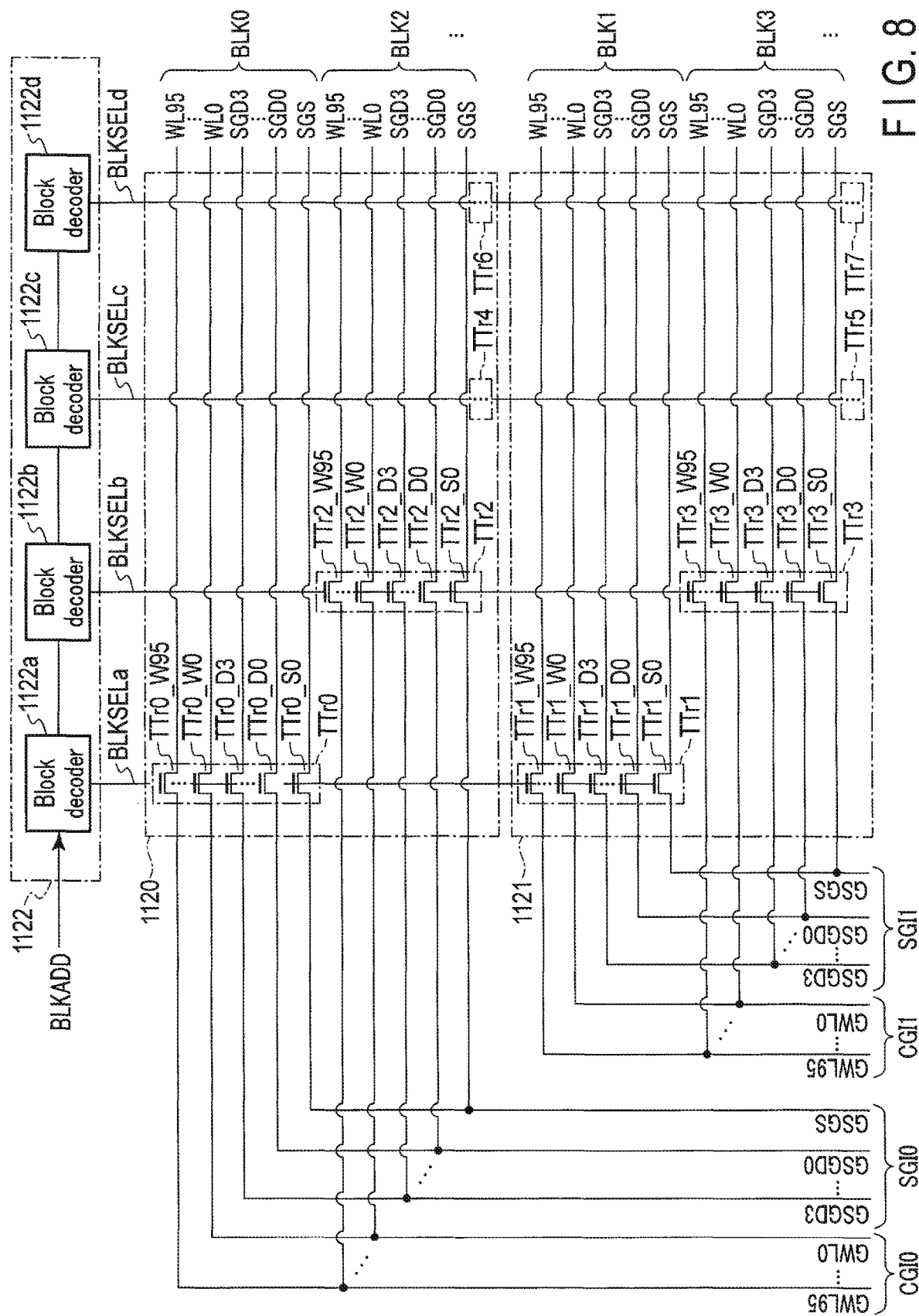
FIG. 8 is a diagram showing an example of the circuit configuration of transfer switch groups in the row decoder module of the semiconductor memory device according to the first embodiment.

FIG. 8 is a diagram showing an example of the circuit configuration of each of the transfer switch groups 1120 and 1121 in the row decoder module 112 of the semiconductor memory device 1 according to the first embodiment.

Transfer switch group 1120 includes a plurality of transfer transistor groups TTr0, TTr2, TTr4, and TTr6. Transfer transistor group TTr0 corresponds to block BLK0, transfer transistor group TTr2 corresponds to block BLK2, transfer transistor group TTr4 corresponds to block BLK4, and transfer transistor group TTr6 corresponds to block BLK6. Each transfer transistor group couples interconnect groups CGI0 and SGI0 to the word lines WL0 to WL95 and select gate lines SGD0 to SGD3 and SGS of the block BLK corresponding to the transfer transistor group. Specifically, the following coupling is provided:

Transfer transistor group TTr0 includes transistors TTr0_W0 to TTr0_W95, TTr0_D0 to TTr0_D3, and TTr0_S0. Transfer transistor group TTr2 includes transistors TTr2_W0 to TTr2_W95, TTr2_D0 to TTr2_D3, and TTr2_S0. The same applies to transfer transistor groups TTr4 and TTr6.

The first terminal of transistor TTr0_Wk is coupled to interconnect GWLk in interconnect group CGI0, and the second terminal of the transistor TTr0_Wk is coupled to word line WLk of block BLK0. As noted above, k is an integer of 0 to 95. The first terminal of transistor TTr0_Dj is coupled to interconnect GSGDj in interconnect group SGI0, and the second terminal of the transistor TTr0_Dj is coupled to select gate line SGDj of block BLK0. As noted above, j is an integer of 0 to 3. The first terminal of transistor TTr0_S0 is coupled to interconnect GSGS in interconnect group SGI0, and the second terminal of the transistor TTr0_S0 is coupled to select gate line SGS of block BLK0.

The first terminal of transistor TTr2_Wk is coupled to interconnect GWLk in interconnect group CGI0, and the second terminal of the transistor TTr2_Wk is coupled to word line WLk of block BLK2. The first terminal of transistor TTr2_Dj is coupled to interconnect GSGDj in interconnect group SGI0, and the second terminal of the transistor TTr2_Dj is coupled to select gate line SGDj of block BLK2. The first terminal of transistor TTr2_S0 is coupled to interconnect GSGS in interconnect group SGI0, and the second terminal of the transistor TTr2_S0 is coupled to select gate line SGS of block BLK2. The same applies to transfer transistor groups TTr4 and TTr6.

Transfer switch group 1121 includes a plurality of transfer transistor groups TTr1, TTr3, TTr5, and TTr7. Transfer transistor group TTr1 corresponds to block BLK1, transfer transistor group TTr3 corresponds to block BLK3, transfer transistor group TTr5 corresponds to block BLK5, and transfer transistor group TTr7 corresponds to block BLK7. Each transfer transistor group couples interconnect groups CGI1 and SGI1 to the word lines WL0 to WL95 and select gate lines SGD0 to SGD3 and SGS of the block BLK corresponding to the transfer transistor group. Specifically, the following coupling is provided:

Transfer transistor group TTr1 includes transistors TTr1_W0 to TTr1_W95, TTr1_D0 to TTr1_D3, and TTr1_S0. Transfer transistor group TTr3 includes transistors TTr3_W0 to TTr3_W95, TTr3_D0 to TTr3_D3, and TTr3_S0. The same applies to transfer transistor groups TTr5 and TTr7.

The first terminal of transistor TTr1_Wk is coupled to interconnect GWLk in interconnect group CGI1, and the second terminal of the transistor TTr1_Wk is coupled to word line WLk of block BLK1. The first terminal of transistor TTr1_Dj is coupled to interconnect GSGDj in interconnect group SGI1, and the second terminal of the transistor TTr1_Dj is coupled to select gate line SGDj of block BLK1. The first terminal of transistor TTr1_S0 is coupled to interconnect GSGS in interconnect group SGI1, and the second terminal of the transistor TTr1_S0 is coupled to select gate line SGS of block BLK1.

The first terminal of transistor TTr3_Wk is coupled to interconnect GWLk in interconnect group CGI1, and the second terminal of the transistor TTr3_Wk is coupled to word line WLk of block BLK3. The first terminal of transistor TTr3_Dj is coupled to interconnect GSGDj in interconnect group SGI1, and the second terminal of the transistor TTr3_Dj is coupled to select gate line SGDj of block BLK3. The first terminal of transistor TTr3_S0 is coupled to interconnect GSGS in interconnect group SGI1, and the second terminal of the transistor TTr3_S0 is coupled to select gate line SGS of block BLK3. The same applies to transfer transistor groups TTr5 and TTr7.

The block decoder group 1122 include, for example, four block decoders 1122a, 1122b, 1122c, and 1122d.

Block decoder 1122a is coupled to interconnect BLKSELa. Interconnect BLKSELa is coupled to the gates of the transistors of transfer transistor group TTr0 and the gates of the transistors of transfer transistor group TTr1. Block decoder 1122a corresponds to the block BLK0 corresponding to transfer transistor group TTr0, and corresponds to the block BLK1 corresponding to transfer transistor group TTr1.

Block decoder 1122b is coupled to interconnect BLKSELb. Interconnect BLKSELb is coupled to the gates of the transistors of transfer transistor group TTr2 and the gates of the transistors of transfer transistor group TTr3. Block decoder 1122b corresponds to the block BLK2 corresponding to transfer transistor group TTr2, and corresponds to the block BLK3 corresponding to transfer transistor group TTr3.

Block decoder 1122c is coupled to interconnect BLKSELc. Interconnect BLKSELc is coupled to the gates of the transistors of transfer transistor group TTr4 and the gates of the transistors of transfer transistor group TTr5. Block decoder 1122c corresponds to the block BLK4 corresponding to transfer transistor group TTr4, and corresponds to the block BLK5 corresponding to transfer transistor group TTr5.

Block decoder 1122d is coupled to interconnect BLKSELd. Interconnect BLKSELd is coupled to the gates of the transistors of transfer transistor group TTr6 and the gates of the transistors of transfer transistor group TTr7. Block decoder 1122d corresponds to the block BLK6 corresponding to transfer transistor group TTr6, and corresponds to the block BLK7 corresponding to transfer transistor group TTr7.

The block decoders 1122a to 1122d each decode a block address BLKADD. The block decoders 1122a to 1122d each control ON/OFF of the transistors of the above-described transfer transistor groups TTr in accordance with the decoding result. When the transistors of a transfer transistor group TTr are turned on, the interconnects GWL0 to GWL95, GSGD0 to GSGD3, and GSGS coupled to the transfer transistor group TTr are electrically coupled to the word lines WL0 to WL95 and select gate lines SGD0 to SGD3 and SGS of the block BLK corresponding to the transfer transistor group TTr.

For example, when the block address BLKADD is a block address BLKADD assigned to the block BLK0 corresponding to block decoder 1122a, i.e., when block BLK0 is the selected block BLK, block decoder 1122a raises the potential of interconnect BLKSELa. At this time, the transistors of transfer transistor group TTr0 are turned on, and the transistors of transfer transistor group TTr1 are also turned on. Accordingly, transfer of voltages to selected block BLK0 via chunk CNK0 and transfer of voltages to unselected block BLK1 via chunk CNK1 are enabled. In this case, the other block decoders 1122b, 1122c, and 1122d do not raise the potentials of interconnects BLKSELb, BLKSELc, and BLKSELd. The transistors of transfer transistor groups TTr2 to TTr7 remain OFF.

In this manner, each of the block decoders 1122a to 1122d raises the potential of interconnect BLKSEL coupled to the block decoder when the block address BLKADD is a block address BLKADD assigned to a block BLK corresponding to the block decoder. The block decoders 1122a to 1122d thereby perform the above-described control of electrical coupling of the corresponding blocks BLK.

FIG. 9 is a diagram showing an example of the circuit configuration of block decoder 1122a in the row decoder module 112 of the semiconductor memory device 1 according to the first embodiment. Block decoders 1122b, 1122c, and 1122d each have, for example, the same configuration as the configuration of block decoder 1122a shown in FIG. 9. The configuration of block decoder 1122a described in detail below is merely an example, and various configurations are applicable to block decoder 1122a.

Block decoder 1122a includes n-channel MOS transistors Tr1, Tr3, and Tr4, a p-channel MOS transistor Tr2, inverters IV1 and IV2, and an address determination circuit AD.

The first terminal of transistor Tr1 is coupled to node N1, and the second terminal of the transistor Tr1 is coupled to the first terminal of transistor Tr2. Voltage VRDEC is applied to node N1. Voltage VRDEC is, for example, a voltage higher than the program voltage applied to the control gates of memory cell transistors MT in a write operation. The gate of transistor Tr1 is coupled to interconnect BLKSELa. The second terminal of transistor Tr2 is coupled to interconnect BLKSELa, and the gate of transistor Tr2 is coupled to node N2.

A block address BLKADD retained in the register 14 is input to the input terminal of the address determination circuit AD, and the output terminal of the address determination circuit AD is coupled to the input terminal of inverter IV1. The output terminal of inverter IV1 is coupled to node N2. The input terminal of inverter IV2 is coupled to node N2, and the output terminal of inverter IV2 is coupled to the first terminal of transistor Tr3. The second terminal of transistor Tr3 is coupled to the first terminal of transistor Tr4. The second terminal of transistor Tr4 is coupled to interconnect BLKSELa. Voltage VDDX is applied to the address determination circuit AD, the inverters IV1 and IV2, the gate of transistor Tr3, and the gate of transistor Tr4. Voltage VDDX is, for example, a source voltage.

The address determination circuit AD outputs a high (H)-level signal from the output terminal when the input block address BLKADD is a block address BLKADD assigned to block BLK0 or BLK1 corresponding to block decoder 1122a. In contrast, the address determination circuit AD outputs a low (L)-level signal from the output terminal when the input block address BLKADD is another block address BLKADD.

When an H-level signal is output from the output terminal of the address determination circuit AD, transistors Tr1 and Tr2 are turned on, and the potential of interconnect BLK-SELa is raised based on voltage VRDEC, as described above.

Figure 10:
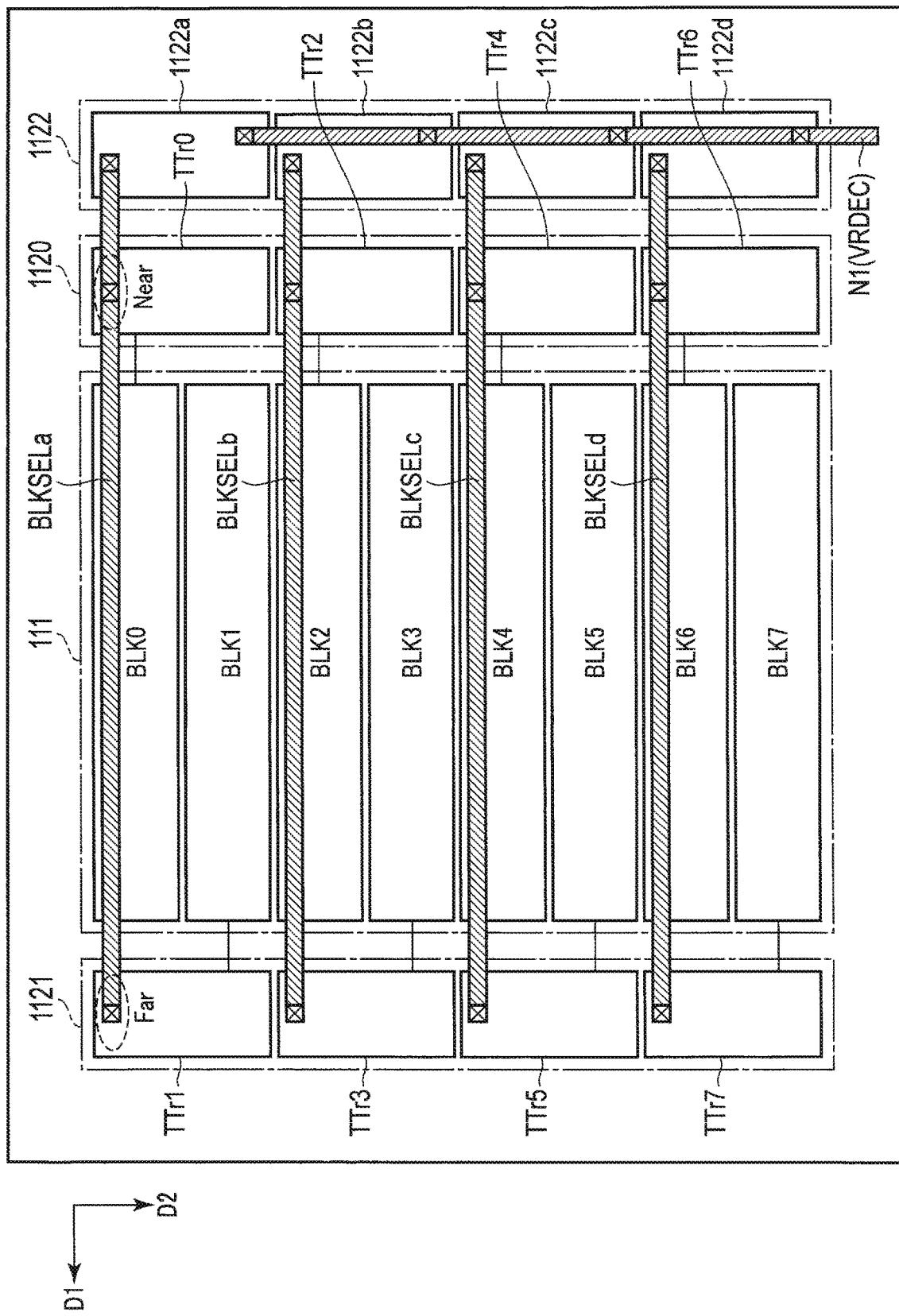
FIG. 10 is a diagram showing an example of the layout of the row decoder module of the semiconductor memory device according to the first embodiment.

FIG. 10 is a diagram showing an example of the layout of the row decoder module 112 of the semiconductor memory device 1 according to the first embodiment. The layout shown in FIG. 10 is merely an example, and the layout of the row decoder module 112 is not limited to the one shown in the figure.

First, the semiconductor memory device 1 includes a semiconductor substrate. The two directions parallel to the surface of the semiconductor substrate and, for example, orthogonal to each other are defined as a first direction D1 and a second direction D2, and the direction, for example, orthogonal to the surface of the semiconductor substrate is defined as a third direction D3. The following described will be provided while assuming the third direction D3 to be upward, and the direction opposite to the third direction D3 to be downward; however, the assumption is merely for convenience, and has nothing to do with, for example, the direction of gravitational force. The memory cell array 111 and row decoder module 112 are provided on the semiconductor substrate.

The memory cell array 111, transfer switch groups 1120 and 1121, and the block decoder group 1122 are arranged, for example, in the first direction D1 in the order of block decoder group 1122, transfer switch group 1120, memory cell array 111, and transfer switch group 1121 to be adjacent to one another.

The blocks BLK0 to BLK7 of the memory cell array 111 are arranged, for example, in the second direction D2 in the order of block BLK0, block BLK1, block BLK2, ..., block BLK7 to be adjacent to one another.

Transfer transistor groups TTr1, TTr3, TTr5, and TTr7 of transfer switch group 1121 are arranged, for example, in the second direction D2 in the order of transfer transistor group TTr1, transfer transistor group TTr3, transfer transistor group TTr5, and transfer transistor group TTr7 to be adjacent to one another.

Transfer transistor groups TTr0, TTr2, TTr4, and TTr6 of transfer switch group 1120 are arranged, for example, in the second direction D2 in the order of transfer transistor group TTr0, transfer transistor group TTr2, transfer transistor group TTr4, and transfer transistor group TTr6 to be adjacent to one another.

The block decoders 1122a to 1122d of block decoder group 1122 are arranged, for example, in the second direction D2 in the order of block decoder 1122a, block decoder 1122b, block decoder 1122c, and block decoder 1122d to be adjacent to one another.

An interconnect corresponding to node N1 extends, for example, in the second direction D2 at least from a region above block decoder 1122a to a region above block decoder 1122d. The interconnect corresponding to node N1 is connected to each of the block decoders 1122a to 1122d, for example, via a contact plug.

Interconnect BLKSELa extends, for example, in the first direction D1 at least from a region above block decoder 1122a through a region above transfer transistor group TTr0 and a region above the memory cell array 111 to a region above transfer transistor group TTr1. Interconnect BLK-SELa is connected to each of block decoder 1122a, transfer transistor group TTr0, and transfer transistor group TTr1, for example, via a contact plug.

Interconnect BLKSELb extends, for example, in the first direction D1 at least from a region above block decoder 1122b through a region above transfer transistor group TTr2 and a region above the memory cell array 111 to a region above transfer transistor group TTr3. Interconnect BLK-SELb is connected to each of block decoder 1122b, transfer transistor group TTr2, and transfer transistor group TTr3, for example, via a contact plug.

Interconnect BLKSELc extends, for example, in the first direction D1 at least from a region above block decoder 1122c through a region above transfer transistor group TTr4 and a region above the memory cell array 111 to a region above transfer transistor group TTr5. Interconnect BLK-SELc is connected to each of block decoder 1122c, transfer transistor group TTr4, and transfer transistor group TTr5, for example, via a contact plug.

Interconnect BLKSELd extends, for example, in the first direction D1 at least from a region above block decoder 1122d through a region above transfer transistor group TTr6 and a region above the memory cell array 111 to a region above transfer transistor group TTr7. Interconnect BLK-SELd is connected to each of block decoder 1122d, transfer transistor group TTr6, and transfer transistor group TTr7, for example, via a contact plug.

Regarding interconnect BLKSELa, the distance between the portion connected to block decoder 1122a and the portion connected to transfer transistor group TTr1 is longer than the distance between the portion connected to block decoder 1122a and the portion connected to transfer transistor group TTr0, for example. Therefore, when block decoder 1122a raises the potential of interconnect BLKSELa based on voltage VRDEC applied to node N1, the rise of the potential of the portion connected to transfer transistor group TTr1 is slower than the rise of the potential of the portion connected to transfer transistor group TTr0, due to, for example, an RC delay.

Hereinafter, let us assume that the block BLK1 corresponding to transfer transistor group TTr1 connected to the portion of interconnect BLKSELa where the rise of the potential is relatively slow (indicated by the symbol "Far") corresponds to the interconnect BLKSEL's far end side. In contrast, let us also assume that the block BLK0 corresponding to transfer transistor group TTr0 connected to the portion of interconnect BLKSELa where the rise of the potential is relatively fast (indicated by the symbol "Near") corresponds to the interconnect BLKSEL's near end side.

Described above is the rise of the potential of interconnect BLKSELa; however, the same applies to interconnect BLK-SELb, interconnect BLKSELc, and interconnect BLKSELd. Namely, blocks BLK2, BLK4, and BLK6 correspond to the interconnect BLKSEL's near end side, whereas blocks BLK3, BLK5, and BLK7 correspond to the interconnect BLKSEL's far end side.

Described above in relation to FIGS. 7 to 10 as an example of the configuration of the row decoder module 112 is the case where one block decoder controls ON/OFF of the transistors of two transfer transistor groups corresponding respectively to blocks BLK. However, the present embodiment is not limited to this case. For example, the row decoder module 112 may have a configuration in which, for example, one block decoder controls ON/OFF of the transistors of 4, 8, or 16 transfer transistor groups. In addition, the block decoder may be prepared for each transfer transistor group corresponding to a block BLK. As described above, various configurations other than the above-described one may be applied to the row decoder module 112.

Operation Example

Figure 11:
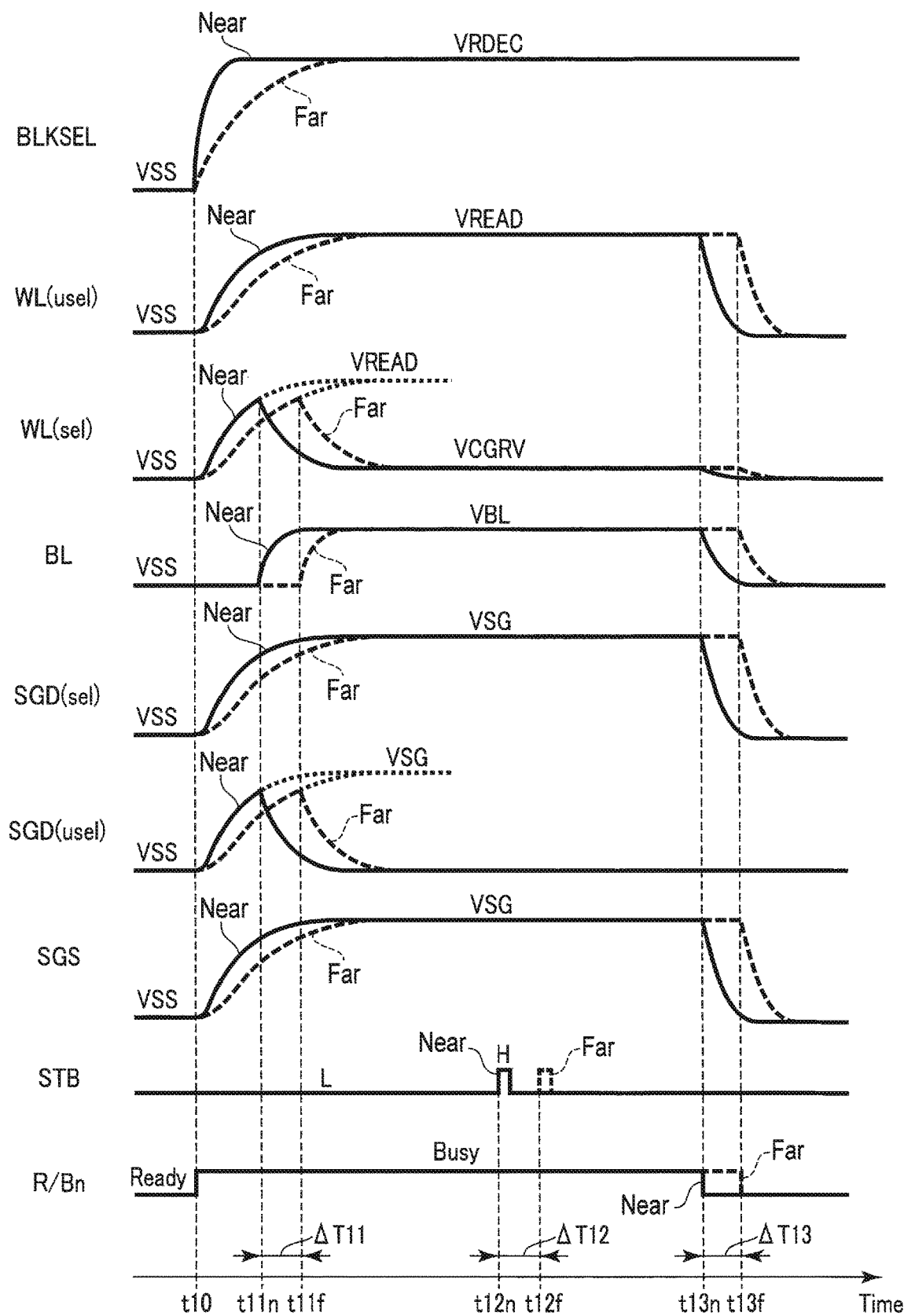
FIG. 11 is a timing chart showing an example of temporal changes in voltages applied to various circuit elements used in a read operation at the semiconductor memory device according to the first embodiment.

FIG. 11 is a timing chart showing an example of temporal changes in voltages applied to various circuit elements used in a read operation at the semiconductor memory device 1 according to the first embodiment. FIG. 11 shows a case where a read operation using read voltage VCGRV is executed on the memory cell array 111 in plane PB00. In the case of FIG. 11, the semiconductor memory device 1 is of the MLC type, and a read operation to read a lower page is performed. In this case, read voltage VCGRV corresponds to, for example, read voltage BR described with reference to FIG. 5. In FIG. 11, the voltage applied to the source line CELSRC is omitted for easier understanding. The read operation described below in detail is merely an example, and the read operation according to the present embodiment is not limited to this.

In the following description, of the word lines WL of the selected block BLK, the word line coupled to a selected memory cell transistor MT will be referred to as the selected word line WL(sel), and word lines not coupled to the selected memory cell transistor MT will be referred to as unselected word lines WL(usel). Of the select gate lines SGD of the selected block BLK, the select gate line SGD of the selected string unit SU will be referred to as the selected select gate line SGD(sel), and select gate lines of unselected string units SU will be referred to as unselected select gate lines SGD(usel).

In FIG. 11, a case where a block BLK corresponding to the interconnect BLKSEL's far end side described with reference to FIG. 10 is selected is indicated by a broken line accompanied by the symbol "Far". In contrast, a case where a block BLK corresponding to the interconnect BLKSEL's near end side described with reference to FIG. 10 is selected is indicated by a solid line accompanied by the symbol "Near". Regarding interconnect BLKSEL, shown are changes of the potential of the above-described portion of interconnect BLKSEL relating to the selected block BLK which is connected to the transfer transistor group TTr corresponding to the selected block BLK.

Voltage application to word lines WL(sel) and WL (usel) and select gate lines SGD(sel), SGD(usel), and SGS is performed by control of the voltage generation circuit 16, the driver set 17, and the row decoder module 112 by the sequencer 15. Voltage application to source line CELSRC is performed by control of the voltage generation circuit 16 and the driver set 17 by the sequencer 15. Voltage application to bit line BL is performed by control of the voltage generation circuit 16, the driver set 17, and the sense amplifier module 113 by the sequencer 15. Control signal STB is supplied from the sequencer 15. Ready/busy signal R/Bn is generated by control of the logic control circuit 13 by the sequencer 15.

In the case of FIG. 11, before the read operation, the voltages applied to interconnect BLKSEL, word lines WL(sel) and WL(usel), select gate lines SGD(sel), SGD (usel), and SGS, and bit lines BL are voltage VSS. The voltage of control signal STB is at the L level, and ready/busy signal R/Bn indicates that the semiconductor memory device 1 is in the ready state. From the start to end of the read operation, the voltage applied to source line CELSRC is voltage VSS.

First, the case where a block BLK corresponding to the above-described interconnect BLKSEL's far end side is selected will be described.

At time t10, the potential of interconnect BLKSEL is raised based on voltage VRDEC, and the transistors of the transfer transistor group TTr coupled to the selected block BLK are turned on. In response to this, voltage VREAD is applied to word lines WL(sel) and WL(usel), and voltage VSG is applied to select gate lines SGD(sel), SGD(usel), and SGS. At this time, ready/busy signal R/Bn indicates that the semiconductor memory device 1 is in the busy state. By applying voltage VREAD to selected word line WL (sel) and voltage VSG to unselected select gate lines SGD(usel), for example, charge in the channels of the memory cell transistors MT included in the unselected string units SU is discharged.

Next, at time t11$f$, the voltage applied to selected word line WL(sel) is changed to voltage VCGRV, and the voltage applied to unselected select gate lines SGD(usel) is changed to voltage VSS. In addition, bit lines BL are started to be charged at time t11$f$. For the charge, voltage VBL is applied to bit lines BL. Voltage VBL is a voltage that enables a read current to flow into a bit line BL, for example, when the corresponding selected memory cell transistor MT is ON. The time when the voltage applied to selected word line WL(sel) is changed to voltage VCGRV, the time when the voltage applied to unselected select gate lines SGD(usel) are changed to voltage VSS, and the time when bit lines BL are charged are not necessarily the same.

After the potential of each of word lines WL (sel) and WL(usel), select gate lines SGD(sel), SGD(usel) and SGS, and bit lines BL are stabilized, sense amplifier circuits SA change the potentials of the sense nodes. After that, control signal STB is brought to the H level and is asserted at time t12$f$. Accordingly, read data based on read voltage VCGRV is transferred to latch circuits in the sense amplifier module 113.

After that, each interconnect is discharged at time t13$f$. Specifically, the voltages applied to word lines WL(sel) and WL(usel), select gate lines SGD(sel) and SGS, and bit lines BL are changed to voltage VSS. At this time, ready/busy signal R/Bn indicates that the semiconductor memory device 1 is in the ready state.

Next, the case where a block BLK corresponding to the above-described interconnect BLKSEL's near end side is selected will be described.

Control of the voltages applied to various circuit elements at time t10 is the same as that in the above-described case where a block BLK corresponding to the interconnect BLKSEL's far end side is selected. However, as shown in FIG. 11, the rise of the potential of interconnect BLKSEL in this case is faster than that in the case where a block BLK corresponding to the interconnect BLKSEL's far end side is selected. Accordingly, the time when the transistors of the transfer transistor group TTr coupled to the selected block BLK are turned on is earlier than that in the case where a block BLK corresponding to the interconnect BLKSEL's far end side is selected. Consequently, as shown in FIG. 11, the rise of the potential of each of word lines WL(sel) and WL(usel) and select gate lines SGD (sel), SGD (usel), and SGS becomes faster than that in the case where a block BLK corresponding to the interconnect BLKSEL's far end side is selected.

Next, at time t11$n$, the voltage applied to selected word line WL(sel) is changed to voltage VCGRV, and the voltage applied to unselected select gate lines SGD(usel) is changed to voltage VSS. In addition, bit lines BL are started to be charged at time t11n. For the charge, voltage VBL is applied to bit lines BL. For example, time t11n is the time when the potential of selected word line WL(sel) equals the potential of selected word line WL(sel) at time t11f in the case where a block BLK corresponding to the interconnect BLKSEL's far end side is selected. Time t11n is not limited to this, and may be any time earlier than time t11f. In the case of FIG. 11, time t11n is earlier than time t11f by time ΔT11. The time when the voltage applied to selected word line WL(sel) is changed to voltage VCGRV, the time when the voltage applied to unselected select gate lines SGD(usel) is changed to voltage VSS, and the time when bit lines BL are charged are not necessarily the same.

After the potentials of word lines WL(sel) and WL(usel), select gate lines SGD(sel), SGD(usel) and SGS, and bit lines BL are stabilized, the sense amplifier circuits SA change the potentials of the sense nodes. After that, control signal STB is brought to the H level and is asserted at time t12n. Accordingly, read data based on read voltage VCGRV is transferred to latch circuits in the sense amplifier module 113. Time t12n is earlier than time t12f by time ΔT12. Time ΔT12 may be the same as time ΔT11.

After that, each interconnect is discharged at time t13n. Specifically, the voltages applied to word lines WL(sel) and WL(usel), select gate lines SGD(sel) and SGS, and bit lines BL are changed to voltage VSS. At this time, ready/busy signal R/Bn indicates that the semiconductor memory device 1 is in the ready state. Time t13n is earlier than time t13f by time ΔT13. Time ΔT13 may be the same as one or both of time ΔT11 and time ΔT12.

The read operation described above in detail is merely an example. The read operation may be any read operation in which, in the case where a block BLK corresponding to the interconnect BLKSEL's near end side is selected, the time when control signal STB is brought to the H level and the times when the voltages applied to interconnects (such as word lines WL and select gate lines SGD and SGS) are changed are earlier and the time when ready/busy signal R/Bn is changed to indicate that the semiconductor memory device 1 is in the ready state at the end of the read operation is earlier than in the case where a block BLK corresponding to the interconnect BLKSEL's far end side is selected.

Described above is a case where the semiconductor memory device 1 is of the MLC type, and a read operation to read a lower page is performed; however, the present embodiment is not limited to such a case. For example, the above-described control may be performed in the case where a plurality of read voltages are successively applied as in an upper page read operation, and the case where a read operation is performed at a semiconductor memory device of another type such as the SLC type.

Although a read operation is described in detail above, the control timing relating to various operations can be changed as described above between the case where a block BLK corresponding to the interconnect BLKSEL's near end side is selected and the case where a block BLK corresponding to the interconnect BLKSEL's far end side is selected, for example, in a verification operation, a write operation, and an erase operation.

For example, CG drivers 17_0 to 17_23, the CGU driver 17_24, the SGD_SEL driver 1726, the SGD_USEL driver 17_27, the SGS_SEL driver 17_28, which are described with reference to FIG. 7, start transfer of voltages to interconnects CG0 to CG23, CGU, SGD_SEL, SGD_USEL, and SGS_SEL based on control signals supplied from the sequencer 15. For example, those drivers discharge interconnects CG0 to CG23, CGU, SGD_SEL, SGD_USEL, and SGS_SEL similarly based on control signals supplied from the sequencer 15.

In the semiconductor memory device 1, when a block BLK corresponding to the interconnect BLKSEL's near end side is selected, for example, based on a block address BLKADD, the sequencer 15 supplies those control signals to the drivers earlier. In this case, voltages are transferred to interconnects CG0 to CG23, CGU, SGD_SEL, SGD_USEL, and SGS_SEL earlier, and those interconnects are discharged earlier. Accordingly, as described with reference to FIG. 11, the voltages applied to word lines WL and select gate lines SGD and SGS can be changed earlier. Consequently, ready/busy signal R/Bn is changed to indicate that the semiconductor memory device 1 is in the ready state earlier. In the case where a block BLK corresponding to the interconnect BLKSEL's near end side is selected, the sequencer 15 supplies control signal STB to the sense amplifier module 113 earlier.

[Effect]

The row decoder module 112 of the semiconductor memory device 1 includes transfer switch group 1120, transfer switch group 1121, and the block decoder group 1122. As described with reference to FIGS. 8 to 10, block decoder 1122a of the block decoder group 1122 is coupled to transfer transistor group TTr0 of transfer switch group 1120 and transfer transistor group TTr1 of transfer switch group 1121 via interconnect BLKSELa. Block decoder 1122a raises the potential of interconnect BLKSELa based on voltage VRDEC, thereby turning on the transistors of transfer transistor group TTr0 and the transistors of transfer transistor group TTr1. This enables transfer of voltages supplied from the voltage generation circuit 16 and the driver set 17 to the block BLK0 corresponding to transfer transistor group TTr0 and the block BLK1 corresponding to transfer transistor group TTr1.

As described with reference to FIG. 10, transfer switch group 1120, transfer switch group 1121, and the block decoder group 1122 are provided in the first direction D1 in the order of block decoder group 1122, transfer switch group 1120, and transfer switch group 1121, and the memory cell array 111 is provided between transfer switch groups 1120 and 1121. Accordingly, regarding interconnect BLKSELa, the distance between the portion connected to block decoder 1122a and the portion connected to transfer transistor group TTr1 is longer than the distance between the portion connected to block decoder 1122a and the portion connected to transfer transistor group TTr0. Therefore, as described above, when the potential of interconnect BLKSELa is raised based on voltage VRDEC, the rise of the potential of the portion connected to transfer transistor group TTr1 is slower than the rise of the potential of the portion connected to transfer transistor group TTr0, due to, for example, an RC delay. Therefore, as described with reference to FIG. 11, the above-described transfer of a voltage to a block BLK based on the rise of the potential of interconnect BLKSELa is performed later in the case where a voltage is transferred to the block BLK1 corresponding to transfer transistor group TTr1 than in the case where a voltage is transferred to the block BLK0 corresponding to transfer transistor group TTr0.

In general, when an operation such as a write operation, a read operation, or an erase operation, is performed by a semiconductor memory device, the semiconductor memory device is designed so that, regardless of which block BLK is selected, a voltage is applied to the corresponding interconnect at a time which enables the operation without any problem. Therefore, even when a block BLK to which a voltage is transferred relatively early is selected, and a read operation is executed thereon as described above, sensing is performed at a time when the potentials of the word lines WL, select gate lines SGD and SGS, and bit lines BL are stable in the case where a block BLK to which a voltage is transferred relatively late is selected, and a read operation is executed thereon, and then each interconnect is discharged.

In contrast, in the semiconductor memory device 1 according to the first embodiment, as described with reference to FIG. 11, when a block BLK to which a voltage is transferred relatively early is selected, and a read operation is executed thereon as described above (when a block BLK corresponding to the interconnect BLKSEL's near end side is selected), control signal STB is brought to the H level early, and the voltages applied to interconnects (such as word lines WL and select gate lines SGD and SGS) are changed early. Consequently, ready/busy signal R/Bn is changed to indicate that the semiconductor memory device 1 is in the ready state early at the end of the read operation. In various operations such as a write operation, a read operation, and an erase operation, the semiconductor memory device 1 can perform timing control between the case where a block BLK corresponding to the interconnect BLKSEL's near end side is selected and the case where a block BLK corresponding to the interconnect BLKSEL's far end side is selected.

For example, when voltage VREAD is applied to an interconnect, and then a lower voltage VCGRV is applied thereto, such control can prevent the situation where the potential of the interconnect is unnecessarily raised, and it takes a long time to have the potential of the interconnect stabilized by voltage VCGRV applied later.

The above-described control enables the semiconductor memory device 1 to perform a higher-speed operation. A NAND flash memory capable of a high-speed operation like the semiconductor memory device 1 according to the first embodiment can be used for, for example, the purposes for which other types of memories have been conventionally used.

Second Embodiment

Hereinafter, a semiconductor memory device 1 according to the second embodiment will be described.

Configuration Example

The semiconductor memory device 1 according to the second embodiment has the same configuration as the one described with respect to the semiconductor memory device 1 according to the first embodiment. Hereinafter, a configuration relating to an operation example (to be described later) of the semiconductor memory device 1 according to the second embodiment will be described in more detail. The configuration of plane PB00 will be described as an example; however, the planes PB shown in FIG. 2 each have, for example, the same configuration as the one described below.

Figure 12:
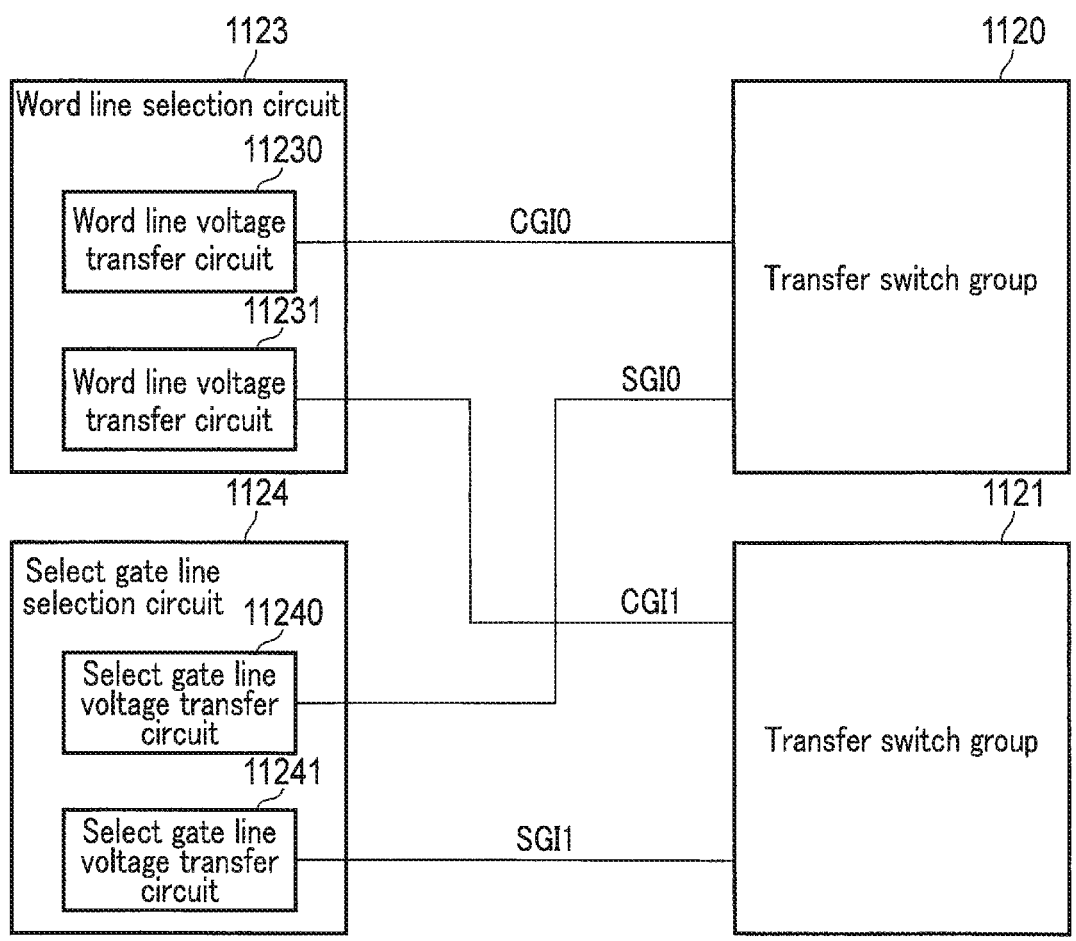
FIG. 12 is a block diagram showing an example of the configuration of a row decoder module of a semiconductor memory device according to a second embodiment.

FIG. 12 is a block diagram showing an example of a more detailed configuration of the row decoder module 112 shown in FIG. 7.

The word line selection circuit 1123 includes word line voltage transfer circuits 11230 and 11231. Word line voltage transfer circuit 11230 is coupled to interconnect group CGI0, and word line voltage transfer circuit 11231 is coupled to interconnect group CGI1.

The select gate line selection circuit 1124 includes select gate line voltage transfer circuits 11240 and 11241. Select gate line voltage transfer circuit 11240 is coupled to interconnect group SGI0, and select gate line voltage transfer circuit 11241 is coupled to interconnect group SGI1.

Figure 13:
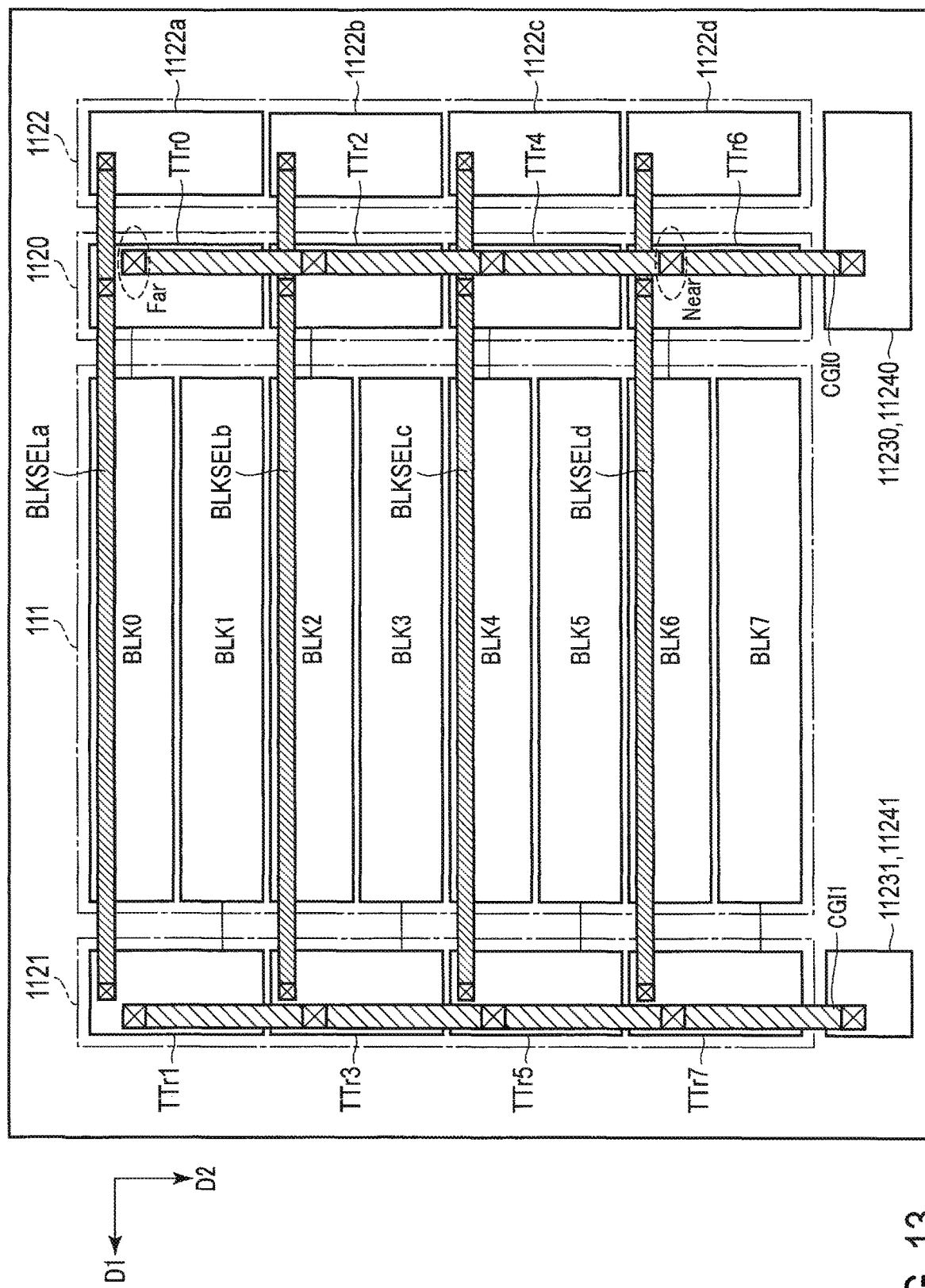
FIG. 13 is a diagram showing an example of the layout of the row decoder module of the semiconductor memory device according to the second embodiment.

FIG. 13 is a diagram showing an example of the layout of the row decoder module 112 of the semiconductor memory device 1 according to the second embodiment. The layout shown in FIG. 13 is also merely an example, and the layout of the row decoder module 112 is not limited to the one shown in the figure.

FIG. 13 shows word line voltage transfer circuits 11230 and 11231, select gate line voltage transfer circuits 11240 and 11241, an interconnect in interconnect group CGI0, and an interconnect in interconnect group CGI1 in addition to what are shown in FIG. 10.

Transfer switch group 1120 and word line voltage transfer circuit 11230 are arranged, for example, in the second direction D2 in the order of transfer switch group 1120 and word line voltage transfer circuit 11230. Transfer switch group 1120 and select gate line voltage transfer circuit 11240 are arranged, for example, in the second direction D2 in the order of transfer switch group 1120 and select gate line voltage transfer circuit 11240.

Transfer switch group 1121 and word line voltage transfer circuit 11231 are arranged, for example, in the second direction D2 in the order of transfer switch group 1121 and word line voltage transfer circuit 11231. Transfer switch group 1121 and select gate line voltage transfer circuit 11241 are arranged, for example, in the second direction D2 in the order of transfer switch group 1121 and select gate line voltage transfer circuit 11241.

An interconnect in interconnect group CGI0 as described above extends, for example, in the second direction D2 at least from a region above transfer transistor group TTr0 to a region above word line voltage transfer circuit 11230. The interconnect is connected to each of transfer transistor groups TTr0, TTr2, TTr4, and TTr6 and word line voltage transfer circuit 11230, for example, via a contact plug. The same applies to the other interconnects in interconnect group CGI0.

Similarly, the interconnects (not shown) in interconnect group SGI0 extend, for example, in the second direction D2 at least from a region above transfer transistor group TTr0 to a region above select gate line voltage transfer circuit 11240. The interconnects are each connected to each of transfer transistor groups TTr0, TTr2, TTr4, and TTr6 and select gate line voltage transfer circuit 11240, for example, via a contact plug.

An interconnect in interconnect group CGI1 extends, for example, in the second direction D2 at least from a region above transfer transistor group TTr1 to a region above word line voltage transfer circuit 11231. The interconnect is connected to each of transfer transistor groups TTr1, TTr3, TTr5, and TTr7 and word line voltage transfer circuit 11231, for example, via a contact plug. The same applies to the other interconnects in interconnect group CGI1.

Similarly, the interconnects (not shown) in interconnect group SGI1 extend, for example, in the second direction D2 at least from a region above transfer transistor group TTr1 to a region above select gate line voltage transfer circuit 11241. The interconnects are each connected to each of transfer transistor groups TTr1, TTr3, TTr5, and TTr7 and select gate line voltage transfer circuit 11241, for example, via a contact plug.

For example, in an interconnect in interconnect group CGI0 as described above, the distance between the portion connected to word line voltage transfer circuit 11230 and the portion connected to transfer transistor group TTr0 is longer than the distance between the portion connected to word line voltage transfer circuit 11230 and the portion connected to transfer transistor group TTr6. Therefore, when word line voltage transfer circuit 11230 applies a voltage to an interconnect in interconnect group CGI0 as described above, the rise of the potential of the portion connected to transfer transistor group TTr0 is slower than the rise of the potential of the portion connected to transfer transistor group TTr6, due to, for example, an RC delay.

Hereinafter, let us assume that the block BLK0 corresponding to transfer transistor group TTr0 connected to the portion of an interconnect in interconnect group CGI0 where the rise of the potential is relatively slow (indicated by the symbol "Far") corresponds to the interconnect group CGI's far end side. In contrast, let us also assume that the block BLK6 corresponding to transfer transistor group TTr6 connected to the portion of an interconnect in interconnect group CGI0 where the rise of the potential is relatively fast (indicated by the symbol "Near") corresponds to the interconnect group CGI's near end side. For any two blocks BLK connected in common to an interconnect in interconnect group CGI0, which of them corresponds to the interconnect group CGI's far end side, and which of them corresponds to the interconnect group CGI's near end side are defined.

Described above is the rise of the potential of an interconnect in interconnect group CGI0; however, the same applies to the other interconnects in interconnect group CGI0, the interconnects in interconnect group CGI1, the interconnects in interconnect group SGI0, and the interconnects in interconnect group SGI1. The blocks BLK corresponding to the interconnect group CGI's near end side also correspond to the interconnect group SGI's near end side, and the blocks BLK corresponding to the interconnect group CGI's far end side also correspond to the interconnect group SGI's far end side.

Operation Example

Figure 14:
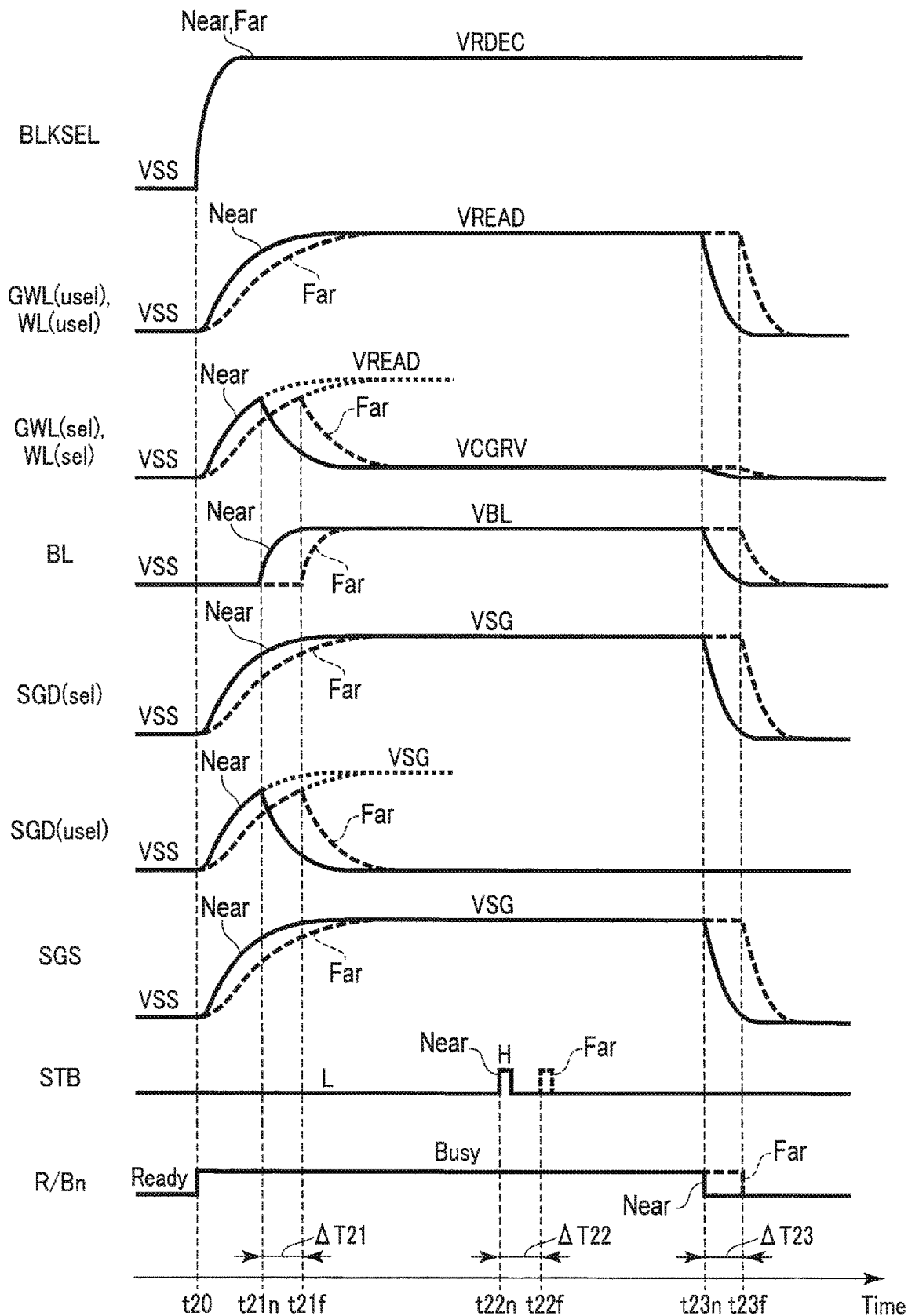
FIG. 14 is a timing chart showing an example of temporal changes in voltages applied to various circuit elements used in a read operation at the semiconductor memory device according to the second embodiment.

FIG. 14 is a timing chart showing an example of temporal changes in voltages applied to various circuit elements used in a read operation at the semiconductor memory device 1 according to the second embodiment. Points different from the timing chart shown in FIG. 11 will be mainly described.

In the following description, of interconnect group CGI0 or CGI1, the interconnect coupled to the selected word line WL(sel) of the selected block BLK will be referred to as interconnect GWL(sel), and interconnects coupled to unselected word lines WL(usel) of the selected block BLK will be referred to as interconnects GWL(usel).

In FIG. 14, a case where a block BLK corresponding to the interconnect CGI's far end side described with reference to FIG. 13 is selected is indicated by a broken line accompanied by the symbol "Far". In contrast, a case where a block BLK corresponding to the interconnect CGI's near end side described with reference to FIG. 13 is selected is indicated by a solid line accompanied by the symbol "Near". FIG. 14 also shows changes in the potential of the above-described portion of each of interconnects GWL(sel) and GWL(usel) which is connected to the transfer transistor group TTr corresponding to the selected block BLK for reference. For easier understanding, FIG. 14 does not show the delay that may occur in voltage transfer between the relevant portion of interconnect GWL(sel) and word line WL(sel) or the delay that may occur in voltage transfer between the relevant portion of interconnect GWL(usel) and word line WL(usel).

In the case of FIG. 14, as in the case of FIG. 11, before the read operation, the voltages applied to interconnect BLKSEL, word lines WL(sel) and WL(usel), select gate lines SGD(sel), SGD(usel), and SGS, and bit lines BL are voltage VSS. The voltage of control signal STB is at the L level, and ready/busy signal R/Bn indicates that the semiconductor memory device 1 is in the ready state. From the start to end of the read operation, the voltage applied to source line CELSRC is voltage VSS.

As in the case of FIG. 11, at time t20, the potential of interconnect BLKSEL is raised based on voltage VRDEC, and the transistors of the transfer transistor group TTr coupled to the selected block BLK are turned on. In response to this, voltage VREAD is applied to word lines WL(sel) and WL (usel), and voltage VSG is applied to select gate lines SGD(sel), SGD(usel), and SGS. At this time, ready/busy signal R/Bn indicates that the semiconductor memory device 1 is in the busy state.

The rise of the potential of interconnect BLKSEL is equivalent between the case where a block BLK corresponding to the interconnect group CGI's far end side is selected and the case where a block BLK corresponding to the interconnect group CGI's near end side is selected. This is because two blocks BLK defined as corresponding to the interconnect group CGI's far end side and the interconnect group CGI's near end side respectively, as described above, both correspond to the interconnect BLKSEL's far end side or the interconnect BLKSEL's near end side described with reference to FIG. 10. In contrast, as shown in FIG. 14, the rise of the potential of each of interconnects GWL (sel) and GWL (usel) at this time is faster when a block BLK corresponding to the interconnect group CGI's near end side is selected than when a block BLK corresponding to the interconnect group CGI's far end side is selected.

Therefore, in the case of FIG. 14, since the interconnects GWL(sel) and GWL(usel) are electrically coupled to word lines WL(sel) and WL(usel) respectively, the rise of the potential of each of the word lines WL(sel) and WL(usel) is also faster when a block BLK corresponding to the interconnect group CGI's near end side is selected than when a block BLK corresponding to the interconnect group CGI's far end side is selected, as in the case of FIG. 11. The same applies to the rise of the potential of each of select gate lines SGD(sel), SGD(usel), and SGS.

Therefore, the semiconductor memory device 1 according to the second embodiment can perform the same operations as those described with reference to FIG. 11 as subsequent operations. Namely, the semiconductor memory device 1 according to the second embodiment can also bring control signal STB to the H level earlier, change the voltages applied to interconnects (such as word lines WL, select gate lines SGD and SGS) earlier, and make ready/busy signal R/Bn indicate that the semiconductor memory device 1 is in the ready state at the end of the read operation earlier when a block BLK corresponding to the interconnect group CGI's near end side is selected than when a block BLK corresponding to the interconnect group CGI's far end side is selected.

For, for example, some or all blocks BLK of blocks BLK0 to BLK7, the semiconductor memory device 1 according to the second embodiment may be configured to perform the above-described timing control between a block BLK corresponding to the interconnect group CGI's far end side and a block BLK corresponding to the interconnect group CGI's near end side based on, for example, the block address BLKADD.

As described above, the semiconductor memory device 1 according to the second embodiment enables a higher-speed operation as in the first embodiment.

Third Embodiment

Hereinafter, a semiconductor memory device 1 according to the third embodiment will be described.

Configuration Example

The semiconductor memory device 1 according to the third embodiment has the same configuration as the one described with respect to the semiconductor memory device 1 according to the second embodiment. Hereinafter, a configuration relating to an operation example (to be described later) of the semiconductor memory device 1 according to the third embodiment will be described in more detail.

In the semiconductor memory device 1, for example, a plane PB is selected based on a plane address and, of the selected plane PB, a target block BLK on which various operations, such as a read operation and a write operation, are performed is selected based on a block address BLKADD.

Figure 15:
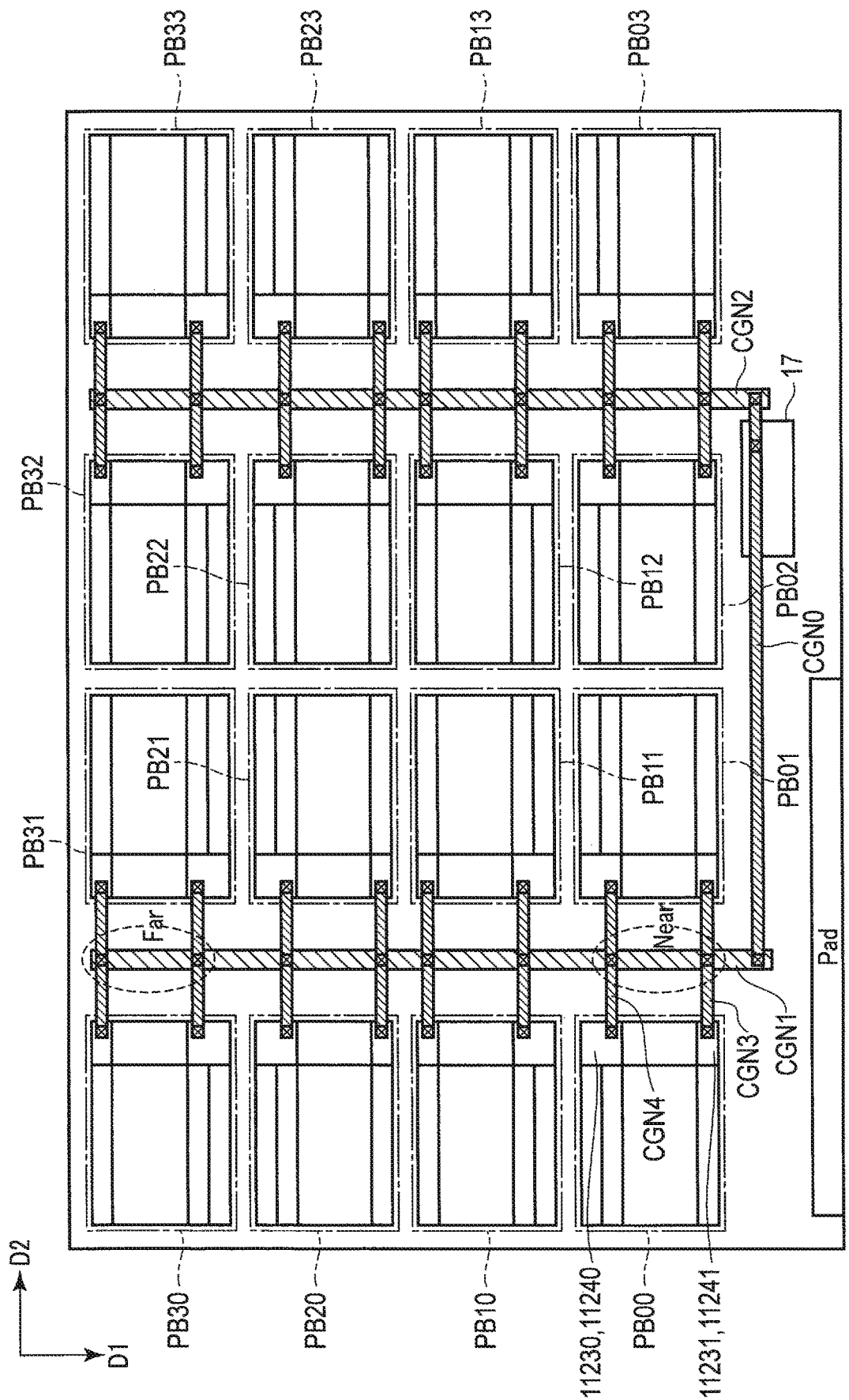
FIG. 15 is a diagram showing an example of the layout of a plurality of planes and a driver set of a semiconductor memory device according to a third embodiment.

FIG. 15 is a diagram showing an example of the layout of a plurality of planes PB and a driver set 17 of the semiconductor memory device 1 according to the third embodiment. The layout shown in FIG. 15 is also merely an example, and the layout of the planes PB and the driver set 17 is not limited to the one shown in the figure.

The planes PB and the driver set 17 are arranged, for example, in the first direction D1 in the order of planes PB and driver set 17.

The layout of the planes PB will be described.

Set A of planes PB00, PB10, PB20, and PB30, set B of planes PB01, PB11, PB21, and PB31, and set C of planes PB02, PB12, PB22, and PB32, and set D of planes PB03, PB13, PB23, and PB33 are arranged, for example, in the second direction D2 in the order of set A, set B, set C, and set D. An interval for, for example, interconnect CGN1 or CGN2 to be described later is provided between sets A and B and between sets C and D.

The planes PB of set A are arranged, for example, in the first direction D1 in the order of plane PB30, plane PB20, plane PB10, and plane PB00. The planes PB of set B are arranged, for example, in the first direction D1 in the order of plane PB31, plane PB21, plane PB11, and plane PB01. The planes PB of set C are arranged, for example, in the first direction D1 in the order of plane PB32, plane PB22, plane PB12, and plane PB02. The planes PB of set D are arranged, for example, in the first direction D1 in the order of plane PB33, plane PB23, plane PB13, and plane PB03.

Next, the layout of an interconnect of the above-described interconnects CG0 to CG23, CGU, UCG, SGD_SEL, SGD_USEL, SGS_SEL, SGS_USEL, and USG will be described. Hereinafter, the interconnect group constituted by those interconnects will be referred to as interconnect group CGN.

Interconnects CGN0 to CGN4 shown in FIG. 15 correspond to an interconnect in interconnect group CGN.

Interconnect CGN0 extends, for example, in the second direction D2 at least in a region above the driver set 17, and the both ends thereof reach regions corresponding to the interval between sets A and B and the interval between sets C and D. Interconnect CGN0 is connected to the driver set 17, for example, via a contact plug.

Interconnect CGN1 extends, for example, between sets A and B in the first direction D1 to at least a region overlapping interconnect CGN0 in the third direction D3. Interconnect CGN1 is connected to interconnect CGN0, for example, via a contact plug.

Interconnect CGN2 extends, for example, between sets C and D in the first direction D1 to at least a region overlapping interconnect CGN0 in the third direction D3. Interconnect CGN2 is connected to interconnect CGN0, for example, via a contact plug.

Interconnect CGN3 extends, for example, in the second direction D2 at least from a region above word line voltage transfer circuit 11231 in plane PB00 to a region overlapping interconnect CGN1 in the third direction D3. Interconnect CGN3 is connected to each of word line voltage transfer circuit 11231 and interconnect CGN1, for example, via a contact plug.

Interconnect CGN4 extends, for example, in the second direction D2 at least from a region above word line voltage transfer circuit 11230 in plane PB00 to a region overlapping interconnect CGN1 in the third direction D3. Interconnect CGN4 is connected to each of word line voltage transfer circuit 11230 and interconnect CGN1, for example, via a contact plug.

Similarly, interconnect CGN1 is also connected to planes PB10, PB20, PB30, PB01, PB11, PB21, and PB31 via interconnects CGN3 and CGN4 or via an interconnect extending in the second direction D2 like interconnects CGN3 and CGN4.

In the manner described for interconnect CGN1, interconnect CGN2 is connected to planes PB02, PB12, PB22, PB32, PB03, PB13, PB23, and PB33.

The layout of an interconnect in interconnect group CGN is described above by using interconnects CGN0 to CGN4; however, the same applies to the other interconnects in interconnect group CGN.

Regarding interconnect CGN1, the distance between the portion connected to interconnect CGN0 and the portion connected to plane PB30 is longer than the distance between the portion connected to interconnect CGN0 and the portion connected to plane PB00. Therefore, when the driver set 17 applies a voltage to interconnect CGN1 via interconnect CGN0, the rise of the potential of the portion connected to plane PB30 is slower than the rise of the potential of the portion connected to plane PB00, due to, for example, an RC delay.

Hereinafter, let us assume that the plane PB connected to a portion of interconnect group CGN1 where the rise of the potential is relatively slow (indicated by the symbol "Far") corresponds to the interconnect group CGN's far end side. In contrast, let us also assume that the plane PB connected to a portion of interconnect group CGN1 where the rise of the potential is relatively fast (indicated by the symbol "Near") corresponds to the interconnect group CGN's near end side. For any two planes PB connected in common to interconnect CGN1, which of them corresponds to the interconnect group CGN's far end side, and which of them corresponds to the interconnect group CGN's near end side may be defined. Similarly, for any two planes PB connected in common to interconnect CGN2, which of them corresponds to the interconnect group CGN's far end side, and which of them corresponds to the interconnect group CGN's near end side may be defined.

Described above is the rise of the potential of an interconnect in interconnect group CGN; however, the same applies to the other interconnects in interconnect group CGN.

Operation Example

Figure 16:
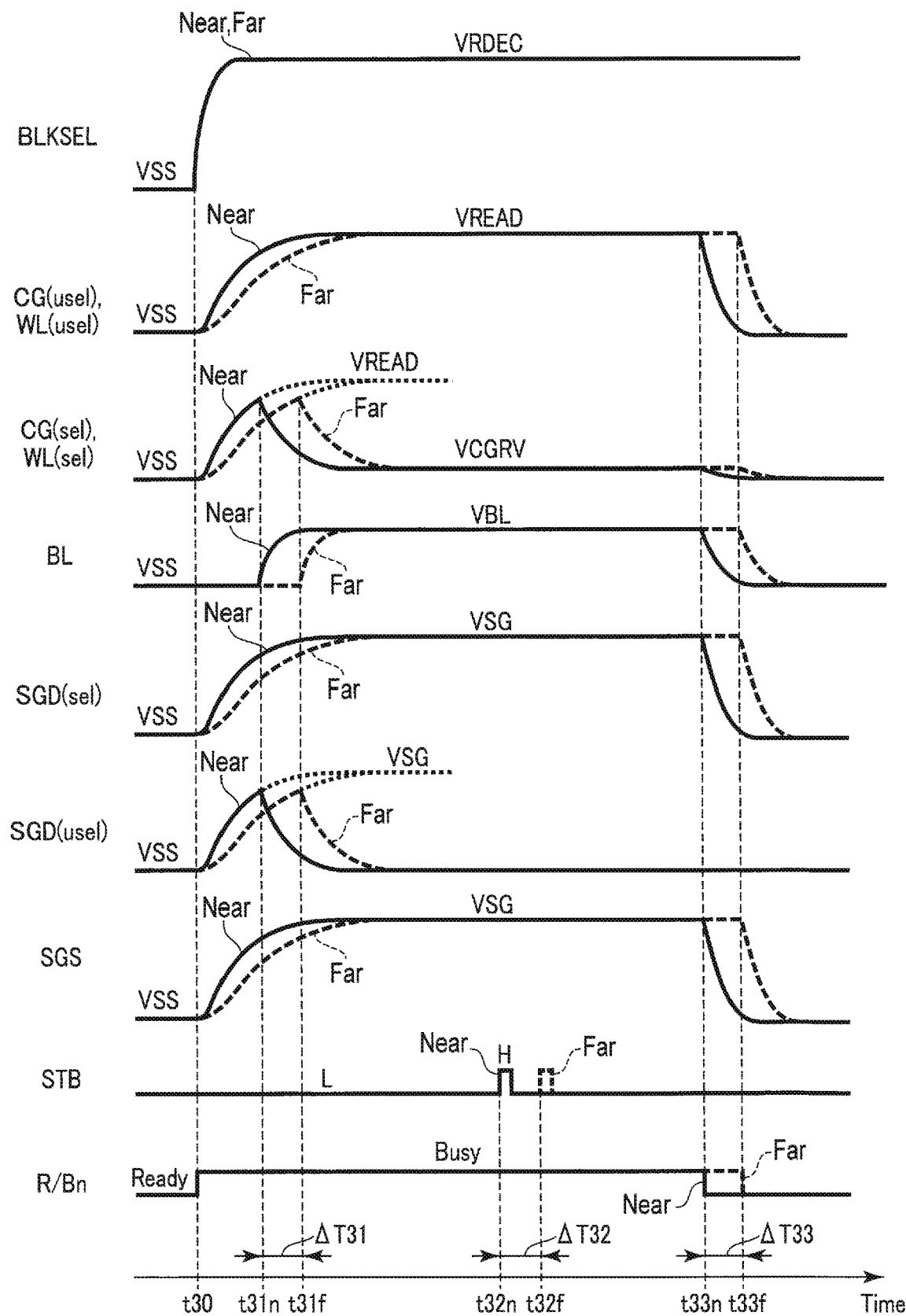
FIG. 16 is a timing chart showing an example of temporal changes in voltages applied to various circuit elements used in a read operation at the semiconductor memory device according to the third embodiment.

FIG. 16 is a timing chart showing an example of temporal changes in voltages applied to various circuit elements used in a read operation at the semiconductor memory device 1 according to the third embodiment. A selected block BLK refers to the selected block BLK in the selected plane PB. Points different from the timing chart shown in FIG. 11 will be mainly described.

In the following description, of interconnect group CGN, the interconnect coupled to the selected word line WL(sel) of the selected block BLK will be referred to as interconnect CG (sel), and the interconnect coupled to unselected word lines WL(usel) of the selected block BLK will be referred to as interconnect CG(usel).

In FIG. 16, a case where a plane PB corresponding to the interconnect group CGN's far end side described with reference to FIG. 15 is selected is indicated by a broken line accompanied by the symbol "Far". In contrast, a case where a plane PB corresponding to the interconnect group CGN's near end side described with reference to FIG. 15 is selected is indicated by a solid line accompanied by the symbol "Near". FIG. 16 also shows changes in the potential of the above-described portion of each of interconnects CG (sel) and CG (usel) which is connected to the selected plane PB for reference. To make reference easier, FIG. 16 does not show the delay that may occur in voltage transfer between the relevant portion of interconnect CG(sel) and word line WL(sel) or the delay that may occur in voltage transfer between the relevant portion of interconnect CG(usel) and word line WL(usel).

In the case of FIG. 16, as in the case of FIG. 11, before the read operation, the voltages applied to interconnect BLKSEL, word lines WL(sel) and WL(usel), select gate lines SGD(sel), SGD(usel), and SGS, and bit lines BL are voltage VSS. The voltage of control signal STB is at the L level, and ready/busy signal R/Bn indicates that the semiconductor memory device 1 is in the ready state. From the start to end of the read operation, the voltage applied to source line CELSRC is voltage VSS.

As in the case of FIG. 11, at time t30, the potential of interconnect BLKSEL is raised based on voltage VRDEC, and the transistors of the transfer transistor group TTr coupled to the selected block BLK are turned on. In response to this, voltage VREAD is applied to word lines WL(sel) and WL(usel), and voltage VSG is applied to select gate lines SGD(sel), SGD(usel), and SGS. At this time, ready/busy signal R/Bn indicates that the semiconductor memory device 1 is in the busy state.

The rise of the potential of interconnect BLKSEL is equivalent between the case where a plane PB corresponding to the interconnect group CGN's far end side is selected and the case where a plane PB corresponding to the interconnect group CGN's near end side is selected. In contrast, as shown in FIG. 16, the rise of the potential of each of interconnects CG(sel) and CG(usel) at this time is faster when a plane PB corresponding to the interconnect group CGN's near end side is selected than when a plane PB corresponding to the interconnect group CGN's far end side is selected.

In the case of FIG. 16, since the rise of the potential of the portion of each of interconnects CG(sel) and CG(usel) which is connected to the selected plane PB is faster when a plane PB corresponding to the interconnect group CGN's near end side is selected than when a plane PB corresponding to the interconnect group CGN's far end side is selected, the rise of the potential of each of word lines WL(sel) and WL(usel) electrically coupled to interconnect CG(sel) and CG(usel) is also faster as in the case of FIG. 11. The same applies to the rise of the potential of each of select gate lines SGD(sel), SGD(usel), and SGS.

Therefore, the semiconductor memory device 1 according to the third embodiment can perform the same operations as those described with reference to FIG. 11 as subsequent operations. Namely, the semiconductor memory device 1 according to the third embodiment can also bring control signal STB to the H level earlier, change the voltages applied to interconnects (such as word lines WL, and select gate lines SGD and SGS) earlier, and make ready/busy signal R/Bn indicate that the semiconductor memory device 1 is in the ready state at the end of the read operation earlier when a plane PB corresponding to the interconnect group CGN's near end side is selected than when a plane PB corresponding to the interconnect group CGN's far end side is selected.

Regarding, for example, some or all planes PB of a plurality of planes PB, the semiconductor memory device 1 according to the third embodiment may be configured to perform timing control between a plane PB corresponding to the interconnect group CGN's far end side and a plane PB corresponding to the interconnect group CGN's near end side based on, for example, a plane address.

As described above, the semiconductor memory device 1 of the third embodiment enables a higher-speed operation as in the first embodiment.

OTHER EMBODIMENTS

In this specification, if the expressions such as "the same", "correspond", "constant", "maintain", etc. are used, some error in the range of design may be involved.

The expression such as a voltage being applied or supplied includes both control to apply or supply the voltage and actual application or supply of the voltage. Application or supply of a voltage includes application or supply of, for example, 0V.

In the specification of the present application, the term "couple" refers to electrical connection, and does not exclude intervention of another component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first group including a plurality of memory cells;
   a second group including a plurality of memory cells; and
   a control circuit configured to successively apply a first voltage and a second voltage which is higher than the first voltage to a first memory cell in the first group or the second group, and to apply a third voltage to the first memory cell after applying the second voltage, wherein when the first memory cell is included in the first group, the control circuit applies the third voltage to the first memory cell a first time earlier with respect to a time when the second voltage is applied than when the first memory cell is included in the second group, and each of the first group and the second group corresponds to a data erase unit or a unit larger than the data erase unit.

2. The device according to claim 1, wherein
each of the first group and the second group corresponds to the data erase unit,
the semiconductor memory device includes a memory cell array including the first group and the second group,
the control circuit comprises:
a first transistor and a second transistor; and
a first circuit configured to perform switching between ON and OFF of each of the first transistor and the second transistor,
the memory cell array is between the first transistor and the second transistor,
the control circuit applies the second voltage to the first memory cell via the first transistor when the first memory cell is included in the first group, and applies the second voltage to the first memory cell via the second transistor when the first memory cell is included in the second group, and
the first circuit is closer to the first transistor than to the second transistor.

3. The device according to claim 2, wherein
the memory cell array is between the first circuit and the second transistor.

4. The device according to claim 2, wherein
the first transistor and the second transistor are coupled to the first circuit via a common interconnect.

5. The device according to claim 1, wherein
the control circuit comprises:
a first transistor and a second transistor; and
a second circuit configured to apply the second voltage to the first memory cell via the first transistor when the first memory cell is included in the first group, and apply the second voltage to the first memory cell via the second transistor when the first memory cell is included in the second group, and the second circuit is closer to the first transistor than to the second transistor.

6. The device according to claim 5, wherein
the first transistor and the second transistor are coupled to the second circuit via a common interconnect.

7. The device according to claim 5, wherein
each of the first group and the second group corresponds to the data erase unit.

8. The device according to claim 7, wherein
the first transistor is between the second transistor and the second circuit.

9. The device according to claim 5, wherein
each of the first group and the second group corresponds to the unit larger than the data erase unit.

10. The device according to claim 1, wherein
the control circuit successively applies the third voltage to the first memory cell after applying the second voltage.

11. The device according to claim 10, wherein
the third voltage is lower than the second voltage.

12. The device according to claim 1, wherein
the third voltage equals the first voltage.

13. The device according to claim 1, wherein
the control circuit is further configured to, when the first memory cell is included in the first group, output a signal indicating that the semiconductor memory device is in a ready state a second time earlier with respect to a time when the second voltage is applied than when the first memory cell is included in the second group.

14. The device according to claim 13, wherein
the second time equals the first time.

15. The device according to claim 1, wherein
the control circuit is further configured to, when the first memory cell is included in the first group, sense data retained in the first memory cell a third time earlier with respect to a time when the second voltage is applied than when the first memory cell is included in the second group.

16. The device according to claim 15, wherein
the third time equals the first time.

* * * * *